US008622560B2

(12) United States Patent
Di Trapani et al.

(10) Patent No.: US 8,622,560 B2
(45) Date of Patent: Jan. 7, 2014

(54) ILLUMINATION DEVICE

(75) Inventors: Paolo Di Trapani, Cavallasca (IT); Marta Cecilia Pigazzini, Esino Lario (IT)

(73) Assignee: Light In Light S.R.L., Como (IT)

( * ) Notice: Subject to any disclaimer, the term of this patent is extended or adjusted under 35 U.S.C. 154(b) by 445 days.

(21) Appl. No.: 13/001,050

(22) PCT Filed: Jun. 19, 2009

(86) PCT No.: PCT/EP2009/057672
§ 371 (c)(1),
(2), (4) Date: Apr. 27, 2011

(87) PCT Pub. No.: WO2009/156347
PCT Pub. Date: Dec. 30, 2009

(65) Prior Publication Data
US 2011/0194270 A1    Aug. 11, 2011

(30) Foreign Application Priority Data

Jun. 24, 2008   (IT) .............................. MI2008A1135

(51) Int. Cl.
*F21V 9/02*   (2006.01)
*F21V 7/00*   (2006.01)

(52) U.S. Cl.
USPC ............................................. 362/2; 362/307

(58) Field of Classification Search
USPC ............................................. 362/2, 147, 307
See application file for complete search history.

(56) References Cited

U.S. PATENT DOCUMENTS

| | | | |
|---|---|---|---|
| 3,907,581 | A | 9/1975 | Willcox |
| 6,791,259 | B1 | 9/2004 | Stokes et al. |
| 7,259,400 | B1 | 8/2007 | Taskar |
| 2004/0233526 | A1 | 11/2004 | Kaminsky et al. |
| 2006/0091779 | A1 | 5/2006 | Takeda et al. |
| 2007/0043496 | A1 | 2/2007 | Ogawa |
| 2007/0231504 | A1 | 10/2007 | Wu |
| 2007/0236939 | A1 | 10/2007 | Ouderkirk et al. |
| 2008/0012032 | A1 | 1/2008 | Bhandarkar et al. |
| 2008/0262117 | A1 | 10/2008 | Avakian et al. |
| 2011/0216542 | A1 | 9/2011 | Trapani et al. |

FOREIGN PATENT DOCUMENTS

| | | |
|---|---|---|
| EP | 0634445 | 1/1995 |
| EP | 1843400 | 10/2007 |
| JP | 2006059723 | 3/2006 |
| WO | 02089175 | 11/2002 |

(Continued)

OTHER PUBLICATIONS

Bucholtz, A., "Rayleigh-scattering calculations for the terrestrial atmosphere," Applied Optics, 34(15) p. 2765-2773 (May 20, 1995).

(Continued)

*Primary Examiner* — Anh Mai
*Assistant Examiner* — Zachary J Snyder
(74) *Attorney, Agent, or Firm* — Bryan A. Santarelli; Graybeal Jackson LLP

(57) ABSTRACT

An embodiment of an illumination device comprising a broad band artificial light source and a non-liquid chromatic diffuser transparent to visible light comprising a dispersion of elements of nanometrical dimensions of a first material with of certain refractive index in a second material with different refractive index, wherein the light is scattered producing a separation and different distribution between cold and hot components of the light originally produced by the source, according to a scattering process in "Rayleigh" regime. The device allows illumination effects similar to those of natural outdoor environments to be reproduced in indoor environments.

20 Claims, 26 Drawing Sheets

(56) References Cited

FOREIGN PATENT DOCUMENTS

| WO | 2007043496 | 4/2007 |
|----|------------|--------|
| WO | 2007105739 | 9/2007 |
| WO | 2009156348 | 12/2009 |
| WO | WO2009156347 A1 | 12/2009 |

OTHER PUBLICATIONS

Genoa Science Festival in 2003 and 2005 and in Vilnius Railway Station (Lithuania) in 2007 (www.diluceinluce.eu).

Grenfell, T.C. et al.,"Representation of a nonspherical ice particle by a collection of independent spheres for scattering and absorption of radiation," Journal of Geophysical Research 104, D24, 31,697-31,709 (Dec. 27, 1999).

Hulst, C. van de, "Light Scattering by Small Particles,"Dover Publications, New York (1981).

Ormocer® (http://www.ormocer.de/EN).

Rivera-Toledo, Martin et al., "Dynamic Modeling and Experimental Validation of the MMA Cell-Cast Process for Plastic Sheet Production," Ind. Eng. Chem. Res. 45, 8539-8553 (2006).

Stockman, A. et al. "The spectral sensitivities of the middle- and long-wavelength-sensitive cones derived from measurements in observers of known genotype," Vision Research vol. 40, 1711-1737 (2000).

Trapani, Paolo Di et al., Non-Final Office Action dated Jul. 18, 2012 for U.S. Appl. No. 12/977,070, filed Dec. 23, 2010 entitled "Optical Sky-Sun Diffuser," 23 pages.

International Search Report based on International Application No. PCT/EP2009/057672, European Patent Office, Oct. 14, 2009, pp. 4.

International Search Report based on International Application No. PCT/EP2009/057674, European Patent Office, Oct. 5, 2009, pp. 3.

Aereogel

PMMA-TiO₂

ILLUMINATION DEVICE

PRIORITY CLAIM

The present application is a national phase application filed pursuant to 35 USC §371 of International Patent Application Serial No. PCT/EP2009/057672, filed Jun. 19, 2009; which further claims the benefit of Italian Patent Application MI2008A001135, filed Jun. 24, 2008; all of the foregoing applications are incorporated herein by reference in their entireties.

RELATED APPLICATION DATA

This application is related to U.S. patent application Ser. No. 12/977,070, entitled OPTICAL SKY-SUN DIFFUSER filed Dec. 23, 2010, and which is incorporated herein by reference in its entirety

TECHNICAL FIELD

An embodiment relates to an illumination device. More in particular, an embodiment relates to an artificial illumination device capable of reproducing in indoor environments the light and colors of the sun and of the sky, by combining a broad-band artificial light source and a particular nanostructured chromatic diffuser.

An embodiment produces an innovative type of artificial illumination capable of reproducing a fundamental and to date neglected aspect of natural illumination, that is, the simultaneous presence of two different light sources, namely skylight and sunlight, which differ in color, intensity, direction and spatial extension. In fact, the sky is responsible for the presence of a scattered light with blue as dominant component, i.e. "cold" in common terms, emitted from an extended surface and therefore capable of illuminating shadows. Instead, the sun is responsible for the presence of a light with a limited blue component, i.e. "warm", which being emitted from an area subtending a limited solid angle, illuminates the objects only with direct light.

BACKGROUND

Improvement in the quality of artificial illumination is today a top priority requirement. In fact, there are increasingly more circumstances in which man finds himself spending a large part of his life in artificial illumination conditions. This is due to the constructional features of many industrial spaces, hospitals, department stores, underground railways, airports and the like, whose indoor areas are not exposed to direct skylight and sunlight. Moreover, in various regions of the planet, the conditions of low temperature (for example in Canada) or, vice versa, high temperature and humidity (for example in Singapore), which characterize lengthy periods of the year, encourage more and more development of underground urban planning, as it is much easier to achieve satisfactory climate control underground. Finally, the quality of artificial illumination has a considerable impact on the quality of life for populations living at high latitudes, where there is little or no sunlight for lengthy periods of the year.

On the other hand, the energy question today places the need to reduce power consumption used for illumination at the forefront. As can be seen from recent legislation, this need provides for the elimination, within a few years, of conventional incandescent lighting, which produces a black body emission spectrum similar to sunlight, but which dissipates most of the energy in heat, in favor of new technologies, such as LEDs and laser diodes. LED technology, already widely used for backlighting screens and panels, in road signs and in motor vehicles, is today preparing to enter the market of indoor and outdoor lighting. One of the main difficulties is in this case constituted by the quality of the lighting, above all for low cost types of sources, which exhibit lower consumption. This is the case, for example of InGaN—GaN LEDs emitting in the blue region (at 430-470 nm) completed by the presence of a phosphor which emits broad-band radiation in the yellow region (around 580 nm). These sources have a spectral profile differing substantially from that of a black body, presenting a peak of maximum intensity at the emission wavelength of the LED, and a second peak of lesser intensity at the maximum phosphor emission efficiency. The difficulty linked to this type of source is related both to the very high color temperature ($\approx$7000K), as described in U.S. Pat. No. 7,259,400 which is incorporated by reference, which gives the light the characteristic bluish color, and to the lack of green and red components in the spectrum. Although this lack is not noticed when illuminating a white object, given that the yellow component produced by the phosphor excites, in a balanced manner, the cones in the eye sensitive to red and green, it becomes important when illuminating colored environments, given that green or red objects appear dark.

Within the scope of current technological development, the majority of efforts aimed at improving the quality of illumination are concentrated on the spectral characteristics of the light produced having the object of making it perceived to be as close as possible to sunlight. Within the context of the definition above, this approach nonetheless does not include the aforesaid fundamental aspect characterizing natural illumination, namely the presence in nature of not one but two different light sources: the sky and the sun. The effect can be understood by considering the different CCT (Correlated Color Temperature) of the two sources, defined as Planck radiator temperature (black body radiation), which is perceived by the eye as a color closer to that of the source in question. If we consider, for example, natural illumination in the late afternoon, when the sky, almost as luminous as the sun, has a CCT of over 9000K, and the sun has a CCT of under 4000K, it is evident that the spectrum resulting from the sum of the two sources is nowhere near a black body spectrum. Nonetheless, this type of illumination is extremely pleasing to the eye. Therefore, the presence of this particular dichromatism, associated with direct and scattered light, is an important element, not considered previously, to be added to the previous ones in order to assess the quality and pleasantness of artificially created illumination.

It is also important to note that an illumination method based on a single type of source can at the most simulate, in the case of a spectral profile similar to that of the sun, "lunar" illumination. In this context, as the shadows are very dark, they are not pleasing. For this reason, artificial illumination often uses many sources, or reflections on walls or ceiling, to minimize shadows.

A first proposal for artificial illumination based on indoor reconstruction of natural illumination as composed of sky and sun was presented in a work exhibited in various science and art exhibitions, also presented at the Genoa Science Festival in 2003 and 2005 and in Vilnius Railway Station (Lithuania) in 2007 (www.diluceinluce.eu, which is incorporated by reference). In these contexts various installations and various experimental apparatus were produced, including "indoor" reconstruction of the sky, i.e. reconstruction of the Rayleigh scattering process caused by nanometrical density fluctuations of a transparent medium which, in the case of the atmosphere, determines the light and color of the sky and of the sun. As scattering medium an aqueous dispersion of silica nanoparticles, with diameter of around 20 nm, was used. This dispersion, presenting refractive index fluctuations of considerable amplitude (approximately 15%) on scale lengths below 1/10 of the wavelength, allowed the production of a good diffuser operating in Rayleigh regime. At the maximum concentrations used, i.e. for a silica volume fraction of 2% of the dispersion volume, it proved capable of producing, on a beam of light passing through it for a few meters, the same color variation which, in the atmosphere, requires hundreds of kilometers of distance. The dispersion thus produced was placed in transparent PMMA containers for containment. "White" light sources were then used to simulate the sun, namely halogen lamps with calibration filters or mercury vapor discharge lamps. By using different dispersion concentrations, different sky volumes, different installation geometries, comprising combinations of containers of different shape and dimension, different positions of sky and sun, and the presence of absorbent or reflective screens to simulate clouds, spectacular reconstructions were obtained of light effects due to the presence of the sky and the sun at different times of day.

However, the dispersion of nanoparticles in water presents numerous problems that make its use in the lighting sphere almost impossible. In fact, due to the different specific weight $P_s$, between water and nanoparticles, which typically increases with the refractive index value of the nanoparticles, $n_1$, (e.g. $P_s=2.2$ g/cm$^3$ and $n_1=1.5$ for SiO$_2$, while $P_s=4.23$ g/cm$^3$ and $n_1=2.7$ for TiO$_2$), the nanoparticles tend to deposit through gravity on the bottom of the container, as they are held in suspension only through Brownian motion. For this reason the suspension must be stirred periodically. For the same reason the concentration of nanoparticles is not constant, but decreases with height. The problem may be reduced, but not eliminated, using nanoparticles of extremely small diameter, in order to maximize the effect of Brownian motion. In this case, however, the scattering efficiency is influenced negatively, a fact that implies the use of diffusers of very high depths (at least in the order of tens of cm). Moreover, the suspension in liquid is somewhat unstable from a bacteriological viewpoint, especially if continuously exposed to light. It then presents the risk of freezing, which prevents its use for outdoor installations. Moreover, the liquid medium presents the problem of containment, which is important in the case of diffusers of medium-large dimensions, and the need to combat pressure due to the height of the liquid, which implies the use of containers produced in thick material (several cm) in the case of heights of over one linear meter.

U.S. Pat. No. 6,791,259 B1, which is incorporated by reference, describes a white light illumination system comprising an LED or laser diode, a light diffuser material and a phosphor or luminescent dye material. The diffuser material preferably comprises particles dispersed in a substrate. The particles that scatter light have a diameter between 50 and 500 nm, preferably a diameter between $\lambda/3$ and $\lambda/2$, where A is the wavelength of the emission peak of the radiation source. In this application, however, the color nanodiffuser is integrated at the level of the active element of the source, that is, it is positioned either before the phosphor or in the phosphor, in order to scatter preferably the blue component produced by the LED or laser diode, otherwise with low divergence, and to uniform it with the yellow component scattered by the phosphor, instead produced with a wide angle of divergence. The fact that the two yellow and blue components are scattered from practically coincident diffuser centers is a necessary condition to remove the "halo" phenomenon, characterized by the presence of a dominant blue color in the direction of maximum emission, and of a dominant yellow color in the peripheral area of the light cone produced by the source, that is, to uniform color distribution of the radiation at different angles.

WO 02/089175, which is incorporated by reference, describes light sources based on UV with reduced dispersion of UV radiation. The light sources are LEDs which emit in the UV and which are combined with UV reflectors constituted by particles dispersed in a solid material transparent to visible light. A phosphorescent material is applied to the UV source to convert UV radiation into visible light. In a particular embodiment the phosphorescent material is applied to the surface of the UV LED and a layer of diffuser material is applied to the phosphorescent layer. The aim of this illumination device structure is to reduce the amount of UV radiation not converted into visible light and does not tackle the problem of reproducing a light similar to natural light produced by the sun and the sky.

SUMMARY

An embodiment, in its numerous variants, produces a new type of artificial illumination device capable of reproducing the simultaneous presence of two different color components: skylight, in which blue (cold) is dominant, and sunlight, with a low blue component ("warm"), which illuminates objects with direct light.

Therefore, while the aim of known illuminating devices is to produce uniform white light, a result at times obtained through appropriate and homogeneous mixing of sources of different color, an embodiment proposes the opposite object of "separating" different color components of a source with broad spectral bandwidth. However, this color separation does not take place generically, as, for example, through the use of a refractor (such as a prism) which diverts different wavelengths to different angles, or of a filter that absorbs a portion of the spectrum of the source and transmits the complementary portion, or of a mirror that reflects and transmits other portions. On the contrary, it takes place as a result of the same mechanism that gives rise to color separation in nature, creating the correct spectral distribution characteristic of skylight and sunlight.

An embodiment is an illumination device comprising a broad-band artificial light source comprising one or more active elements which emit photons or absorb them and then re-emit them at a higher wavelength, and a chromatic diffuser located downstream thereof and comprising elements of a first non-liquid material transparent to visible light and having refractive index $n_1$ dispersed in a second non-liquid material transparent to visible light and having refractive index $n_2$, whereby $|n_2/n_1-1|>0.1$ and whereby the typical linear dimension, d, of the dispersed elements of the first material satisfy the condition 5 nm≤d≤300 nm, characterized in that the maximum dimension ($L_{max}$) of said diffuser is equal to or greater than double the minimum dimension ($d_{min}$) of the projection of the largest active element belonging to said light source in the plane perpendicular to:
  a. in the case of light source with anisotropic emission, the maximum emission direction ($I_{max}$) of said source; or
  b. in the case of light source with isotropic emission, the direction defined by the straight line that joins the two closest points ($I_{prox}$) of said source and of said diffuser, as expressed by the relation $L_{max} \geq 2\ d_{min}$;
wherein the maximum dimension $L_{max}$ of said diffuser is defined as the greater of the maximum distances of two points belonging to the projection of the diffuser in a plane perpendicular or parallel to the directions $I_{max}$ or $I_{prox}$ defined above.

In the case in which $L_{max}$ is the distance between two points belonging to the projection of the diffuser in a plane perpendicular to the directions $I_{max}$ or $I_{prox}$, it is also defined as "transverse dimension" of the diffuser, while in the case in which $L_{max}$ is the distance between two points belonging to the projection of the diffuser in a plane parallel to the directions $I_{max}$ or $I_{prox}$, it is also defined as "longitudinal dimension" of the diffuser.

The phenomenon according to which an embodiment of the device proposed is capable of producing separation and different distribution between "cold" and "warm" components of the light originally produced by the source is the light scattering process in nanostructured transparent materials in "Rayleigh" regime, that is, in conditions in which the increase of scattering efficiency is inversely proportional to the fourth power of the wavelength. This phenomenon is the same one that determines, in nature, the color and luminosity of the sky, the color of shadows as areas illuminated by light coming from the sky, the color of direct sunlight after it has passed through the atmosphere, and its variations according to time of day, seasons, etc.

When a beam of collimated light travels through empty space, or a perfectly transparent, i.e. which does not absorb in the spectral region of interest, and homogeneous medium, it propagates undisturbed, so that the eye can only perceive its presence if it is directly in its path. However, if the transparent medium is not homogeneous, so that it exhibits spatial fluctuations of refractive index, then the path of the beam is "disturbed", and part of the light is diverted from its original trajectory. The method according to which the phenomenon appears depends on the dimensions and forms of these fluctuations.

(i) If the dimensions of the heterogeneities are very large with respect to the wavelength, "refraction" is obtained.

(ii) If the dimensions of the heterogeneities are only slightly larger with respect to the wavelength, "diffraction" is instead obtained.

(iii) If the dimensions of the heterogeneities are comparable or slightly lower with respect to the wavelength, the light is scattered in a substantially homogeneous manner with respect to its spectral components, at least for angularly integrated radiation, and it is scattered principally at small angles with respect to the incident direction. The effect, often called Mie scattering, is that produced by fog and mist.

(iv) Finally, if the dimensions of the non-homogeneities are much smaller than the wavelength of the light, the phenomenon on which an embodiment is based, that is, "Rayleigh scattering", is obtained. This is a process according to which unpolarized light is scattered substantially in all directions with maximum amplitude at 0 and 180 degrees with respect to the incident direction, and with an increase in efficiency inversely proportional to the fourth power of the wavelength.

The most spectacular example of "Rayleigh" scattering in nature is scattering that occurs when sunlight passes through the atmosphere. In this case scattering is produced by refractive index fluctuations associated with density fluctuations of the gases forming this atmosphere. These fluctuations occur at much shorter scale-lengths than the wavelength of sunlight and, especially in the case of the high atmosphere, are spaced apart by a large distance with respect to the scale-length of these fluctuations, and therefore arranged randomly. As a result of the scattering process, the component of solar radiation with the shortest wavelength (that is, blue, given that the near ultraviolet, with even shorter wavelength, is substantially absorbed and barely perceived due to low sensitivity of the human eye in this spectral region) is the one most scattered. The blue component (at 430 nm), is in fact scattered about six times more than the red component (at 670 nm). This important difference in the scattering efficiency is the principal reason determining the blue color of the sky.

To better understand the nature and importance of the light scattering process in the sky, whose indoor reconstruction represents part of an embodiment, it is useful to recall stock photographs describing what happens on the moon, where there is no atmosphere. The sky is black on the moon, even when the sun is at midday. The lunar environment is illuminated by a single source, the sun, whose light is and remains white at all times of the day. The shadow areas, illuminated only by the light reflected by surrounding objects, are almost as dark during the day as at night. Instead, on Earth the environment is illuminated not only by the sun but also by the sky. Direct sunlight, when it has no scattered blue component, has a color varying from pale yellow to orange to red, depending on the different depth of atmosphere crossed in the different hours of the day. The "warm" color of direct sunlight is noted particularly when it illuminates an object through a narrow window, whose limited aperture exposes it entirely to sunlight but shields it from the majority of skylight. The sky, in turn, illuminates the scene with blue. The effect can be noted by looking carefully at shadows. On Earth "in shadow" does not mean "in the dark", as it does on the moon, but in skylight.

Outdoors, with the sun at the zenith, in total absence of reflections, shadows, windows etc., the skylight is summed with the sunlight, obtaining a light not dissimilar to the light that would be obtained in the absence of atmosphere. However, the shadow, even only that of the person observing, is always present, and perceived as more luminous the more the sun is low on the sky.

In order to define the characteristic parameters of an embodiment, it is advisable to take as reference the intervals which in nature characterize (i) the ratio between the power of sunlight and skylight and (ii) the color-temperature values of the two different sources, during different hours of the day, season, etc. In a typical spring day, in the early afternoon, with clear skies and at a subalpine latitude in Italy, it has been measured that the sky contributes for about 20% to the total luminosity, produced by sky+sun. Measurement was performed by comparing the power of the radiation striking an object in the shadow of a screen covering the sun but not the sky, with the power striking the same object without the screen. Assuming that the radiation scattered by the atmosphere towards Earth has the same power as that scattered towards the outside of the atmosphere, and ignoring the effect of the Earth's curvature, it was obtained that the sky scatters incident radiation with a scattering efficiency $\eta=\frac{1}{3}$, where $\eta$ is the fraction of incident light power scattered by the entire depth of the sky. Slightly lower values are obtained when the sun is at the zenith. Higher values are instead obtained in the early morning or in the evening. One hour before sunset, in the same place and season, a scattering efficiency of $\eta=\frac{2}{3}$ was measured. Finally, it is noted that at dawn or dusk almost all the incident light is scattered ($\eta=1$).

With regard to color-temperature assessment of the two sources, it may be advisable to refer to the CCT (Correlated Color Temperature), which is the Planck radiator temperature (black body radiation) perceived by the eye as a color closer to that of the source in question. The CCT relative to the resultant of sky and sun at midday on a clear day is around 5500K, that is, a value of about 10% less than the CCT of solar radiation outside the atmosphere (the difference is due at least partly to the blue radiation scattered outside). The light produced by the clear sky has a CCT typically of between 9000 and 12000K, with much higher values in the early morning or late evening. With regard to the CCT of direct solar radiation it can reach 5200K in conditions with the sun at the zenith, but typically varies between 4700K (at midday) and 3500K (one hour after dawn or before dusk). Even lower CCT values are obtained at sunrise and sunset, through the joint effect of Rayleigh scattering and atmospheric refraction.

In the context of an embodiment, the concept of shadow is revolutionized given that, just as outdoors, in shadow does not mean in the dark, but in skylight. As this approach is capable of reconstructing the color contrast between light and shadow, it allows the particular beauty characterizing the nature of daylight on Earth to be reproduced in indoor environments.

BRIEF DESCRIPTION OF THE DRAWINGS

One or more embodiments will now be illustrated with reference to the accompanying figures, wherein.

DETAILED DESCRIPTION

Figure 1:
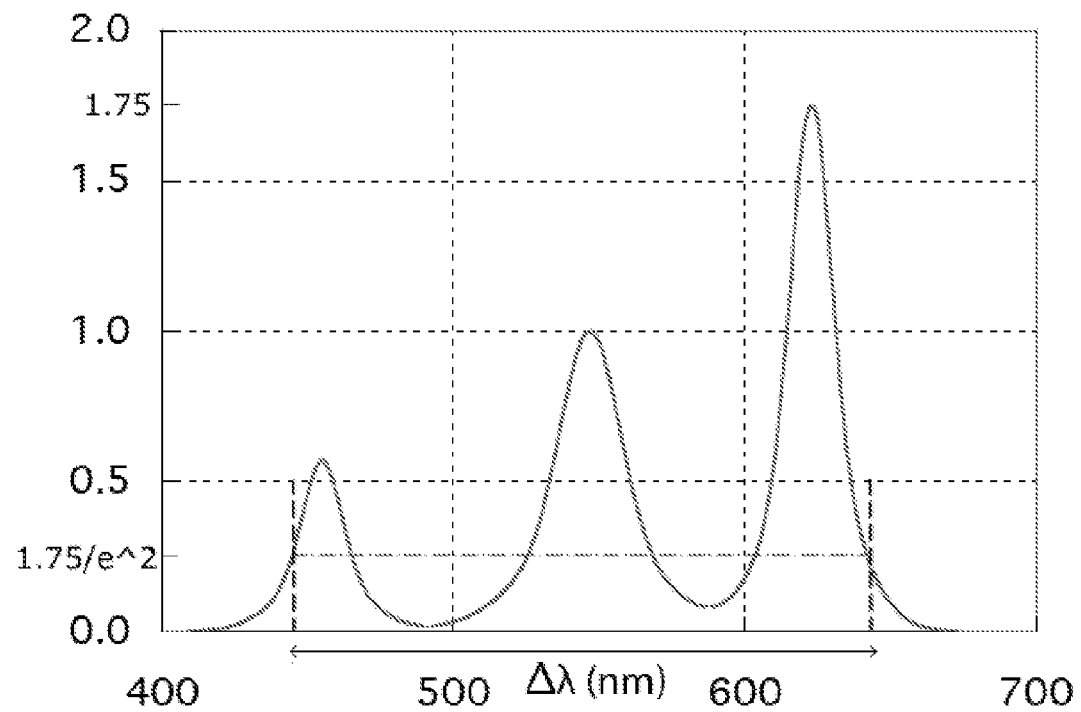
FIG. 1 is a diagram illustrating the definition of spectral bandwidth of a light source according to an embodiment.

An illumination device is produced in two different principal embodiments, which are not alternative but may also be combined:

(i) The first, hereinafter referred to as "midday", has the object of reproducing the natural illumination condition typical of the middle hours of the day. It is characterized by the presence of two components, sky and sun, of different color but each of which is of unequivocally defined color. In fact, at midday the sun is whitish-yellow, and the sky has the same blue color more or less all over. Moreover, at midday the sun dominates the scene, being directly visible from most of it. If an area is exposed only to sunlight, or skylight, or both, it will be illuminated with yellowish, blue or white light.

(ii) The second, hereinafter referred to as "sunset", has the object of reproducing the natural illumination condition typical of evening. In this case the sky does not have the same color all over, due to the long path sunlight has to travel through it, which allows scattering not only of blue but also of the other colors. Moreover, in the evening the sun is not necessarily directly visible, as it is low on the horizon and therefore often blocked by a mountain or building, or by far off clouds. Its presence is perceived as a result of "reflection" or "scattering" of its direct light by clouds, or by mountaintops.

(iii) The third, hereinafter referred to as "after sunset", has the object of reproducing the natural illumination condition typical of when the sun has disappeared beneath the horizon. In this case the only color that remains to tinge the sky and the scene is the blue.

The "midday" embodiment uses a diffuser whose maximum dimension $L_{max}$ is the "transverse dimension", defined as maximum distance between two points belonging to the projection of the diffuser in the plane perpendicular to the maximum emission direction $I_{max}$ or the direction defined by the straight line joining the two closest points ($I_{prox}$) of source and diffuser. In fact, only this condition allows the production of an extended element, which emits scattered light of uniform blue color, capable of coloring shadows. It also allows direct vision of the source from the rest of the scene. Just as in nature, when it has no blue component, direct light assumes a yellowish color.

The "midday" configuration has two different variants.

i) A first "panel" variant with the aim of obtaining illumination by the diffuser of shadows created by the presence of specific objects present on the scene. For this purpose the transverse dimension of the diffuser is large not only with respect to that of the source, but also with respect to that of the objects whose shadow is to be illuminated. It is noted that shadows are portions of the scene from which direct vision of the source (e.g. the sun in nature) is covered by the presence of an obstacle, but not the total or partial vision of the diffuser (e.g. of the sky). Due to the large dimension of the diffuser, the areas on the scene for which direct illumination by the source is prevented by an obstacle can in any case be exposed to the light generated by the diffuser, which therefore colors the shadows thereof.

It is noted that for the effect to be produced the transverse dimension of the diffuser is large with respect to that of the source (in at least a transverse direction), in order to obtain shadow areas illuminated by the diffuser but not directly by the source. It is also noted that the diffuser is a separate element from the source, from which it may be separated by any arbitrary large distance. Indeed, ideal simulations of the natural illumination by direct and diffused light from the sun and the sky would require the source to be placed extremely far from the diffuser in order to guarantee all shadows to have the same orientation. However practical realizations might benefit from closer distances in order to optimize the overall efficiency of the device.

ii) A second variant of this type, hereinafter referred to as "Spot", with the aim of obtaining illumination by the diffuser of portions of the scene outside the light cone that the source would be capable of emitting in the absence of the diffuser.

This objective is achieved using a source that generates, in the absence of the diffuser, a light cone with limited aperture and a diffuser with arbitrarily small transverse dimension with respect to the dimension of the environment, provided it is always greater than double that of the source. In this configuration, the "Spot" source generates two light cones, of different aperture, different intensity (greater on the inside and lesser on the outside) and different color temperature, "warmer" on the inside and "colder" on the outside. The sharper the transition between light and dark in the absence of diffuser, the sharper the transition in intensity and color temperature between the two light cones will be. The effect that this device creates on the scene, with regard to the difference in illumination and coloration intensity produced by the two light cones, is similar to the illumination effect produced by the sun and by the sky. The inner cone ("warm") illuminates the scene as occurs in nature for an object exposed to the sum of afternoon sunlight and skylight. The outer cone ("cold") illuminates the scene as occurs in nature for an object in shadow, exposed only to skylight. In this manner, these areas appear to the view as areas "in shadow" even if the actual object (e.g. the obstacle) that generates this shadow is missing on the scene. Unlike the first "panel" variant, the "Spot" source, is not capable of illuminating the shadows of real objects present on the scene.

It should be noted that for the effect to be produced it is necessary also in this case for the diffuser to have a large transverse dimension with respect to the source (in at least a transverse direction), in order to obtain transmitted and scattered light cones of different aperture. This result may be obtained, for example, by placing the extended diffuser immediately downstream of a collecting lens capable of collimating direct light inside the cone in question, said lens in order to operate correctly must have larger transverse directions to those of said source. Alternatively, the diffuser element may be incorporated in this array of optical elements.

On the contrary, the "sunset" embodiment uses a diffuser whose maximum dimension $L_{max}$ is the longitudinal one, defined as the maximum distance between two points belonging to the projection of the diffuser in a plane parallel to the directions $I_{max}$ or $I_{prox}$ defined above. In fact, only in this case may luminous radiation be transmitted in the diffuser for a path considerably greater than the width of the diffuser in the transverse plane, as moreover occurs in nature in the evening. In fact, at sunset (and also at sunrise) the depth of atmosphere passed through by sunlight, with the sun low on the horizon, is a few hundreds of km, therefore much greater than the height of the atmosphere, in the order of tens of km. This geometrical condition allows all the spectral components of light of the source, starting from blue, then green, yellow, orange, etc., to be effectively scattered by the "sky", until only the red component, which represents direct sunlight at sunset, reaches far off objects.

Unlike the "midday" condition, in which the observer looks at the diffuser panel according to a direction in the region of $I_{max}$ or $I_{prox}$, in the "sunset" configuration the observer looks at the diffuser from a perpendicular direction.

It is noted that in order for different portions of the diffuser to emit light of different color towards the observer, the diffuser has a large longitudinal dimension, and in particular greater than (at least double) the transverse dimension (which will in turn be greater than or equal to that of the projection of the source). In fact, otherwise the light scattered on the inside by a portion of diffuser would be scattered again by other portions before being decoupled on the outside, according to the known "multiple scattering" process. This process would cause mixing between scattered and transmitted components of the light, and therefore mixing of the various color components, which may be compromise the performance of the device according to the proposed object.

"Broad-band artificial light source" is intended as any device that transforms electrical current into luminous radiation with a visible spectral bandwidth $\Delta\lambda>100$ nm, for example $\Delta\lambda>170$ nm, such as $\Delta\lambda>250$ nm, such as a white light source, or perceived as such by the eye, such as an incandescent lamp, a fluorescent lamp, a mercury vapor discharge lamp, an LED or a white light laser diode (that is, such that the primary source is combined with a phosphor or several phosphors), or a combination of LEDs or laser diodes of different color, and the like.

The width of the visible spectral band $\Delta\lambda$ is defined as the amplitude of the interval of wavelengths in the region of the visible spectrum between 400 and 700 nm beyond which the spectrum of the source assumes a value below $1/e^2$ of the peak value, where $e=\exp(1)$. It is noted that the presence of emission peaks beyond the visible region of the spectrum does not contribute to the present definition of spectral width (FIG. 1).

The light source of an embodiment may comprise a plurality of active elements, identical to or different from one another, optionally grouped and/or associated with optical elements such as lenses, filters, screens, achromatic diffusers, and the like capable, for example, of distributing the light uniformly in a wide solid angle, or of concentrating it within a small and well-defined angular aperture.

"Active element" is intended as an element that emits photons, such as an incandescent filament, an ionized gas, an LED or laser diode, or an element that absorbs photons and then re-emits them at a higher wavelength, such as a phosphor or a luminescent element, but not a diffuser, given that this latter does not emit light but simply changes the propagation direction thereof.

Figure 2A:
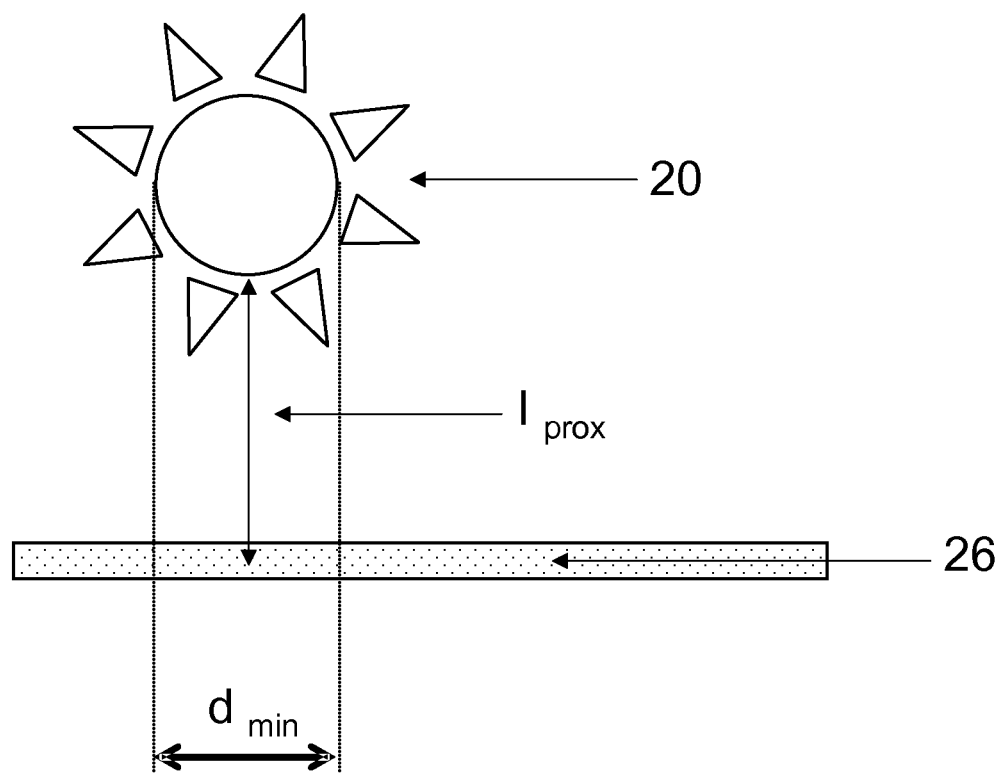
FIGS. 2A, 2B and 3 illustrate the definition of light source dimension according to an embodiment.

"Source dimension" is intended as the minimum dimension of the largest active element contained therein, $d_{min}$, defined as the dimension of the shorter side of the rectangle that circumscribes the projection of this active element in a plane perpendicular to:

a) in the case of light source with anisotropic emission, the maximum emission direction ($I_{max}$) of said source; or b) in the case of a light source with isotropic emission, the direction defined by the straight line that joins the two closest points ($I_{prox}$) of said source and of said diffuser, FIG. 2A illustrates the definition of minimum dimension ($d_{min}$) of an isotropic source 20 in the plane perpendicular to the direction $I_{prox}$, corresponding to the plane of a nanodiffuser 26. In this case $L_{max}$ is around 5 $d_{min}$.

Figure 2B:
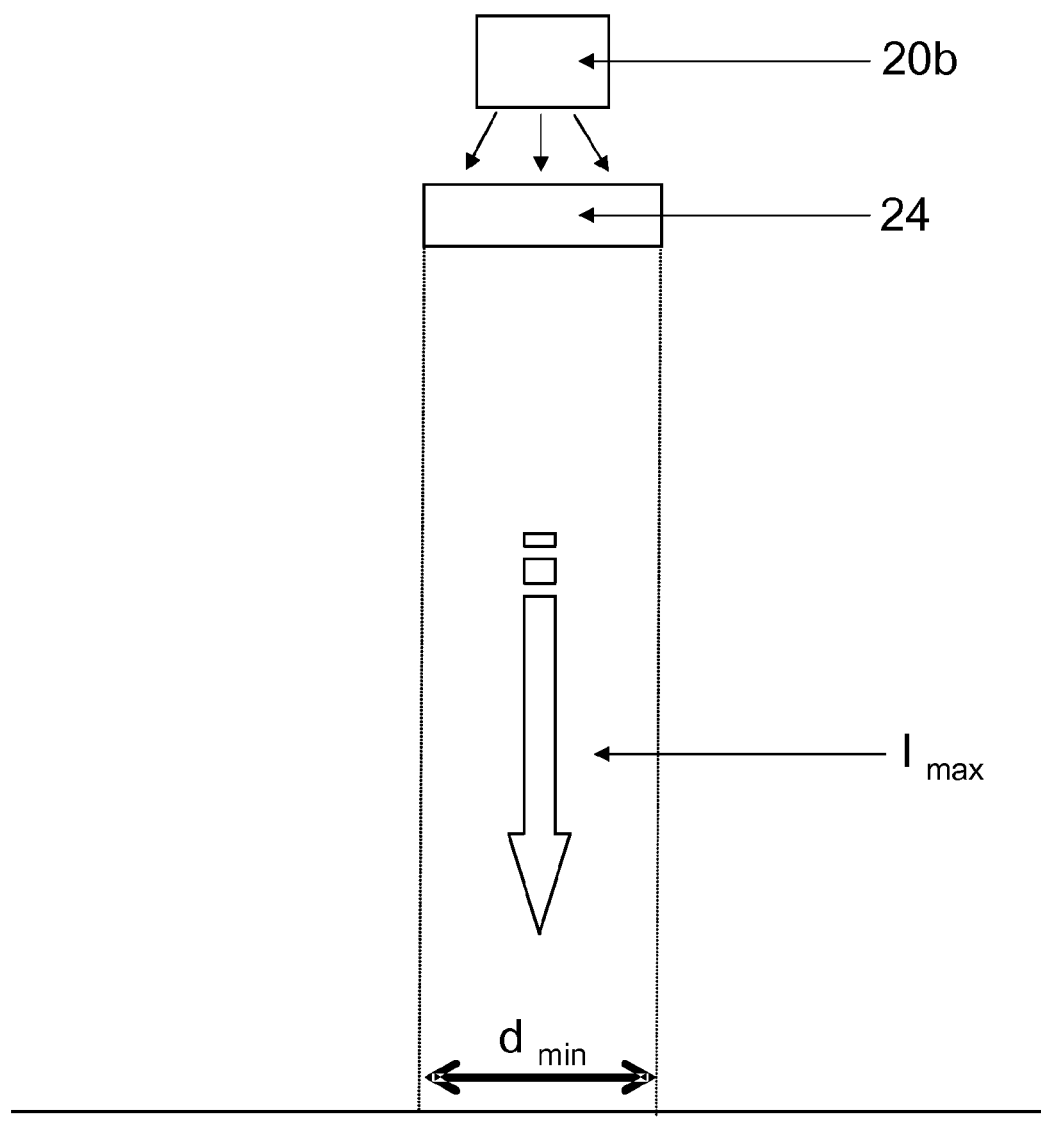

FIG. 2B illustrates the definition of minimum dimension ($d_{min}$) of an anisotropic source constituted by an LED or laser diode 20b and a phosphor 24 on a plane perpendicular to the direction $I_{max}$.

Figure 3:
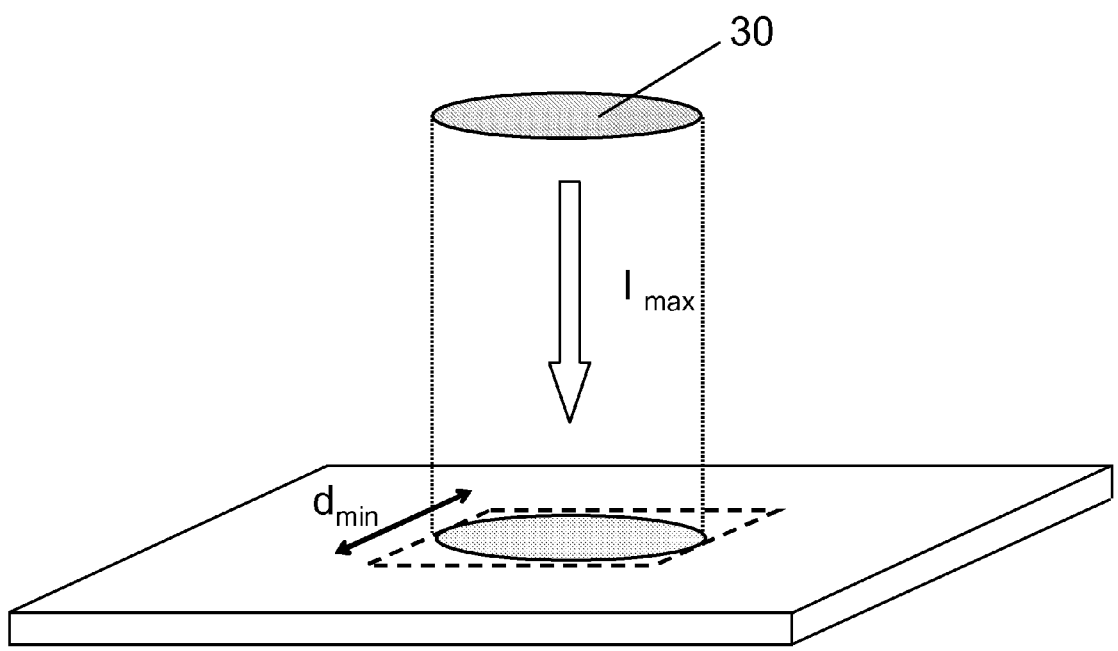

FIG. 3 illustrates the definition of minimum dimension ($d_{min}$) for a source 30 of elliptical shape. In this case the minimum dimension is defined as the shorter side of the rectangle within which the projection of the source in a plane perpendicular to the direction $I_{max}$ may be inscribed.

In a device according to an embodiment, source and diffuser are intended as two separate elements, that is, the diffuser is not superimposed on an active element, or interposed between different active elements, but is positioned downstream of the active element furthest from this source.

"Nanostructured chromatic diffuser" is intended as an object comprising elements of a first non-liquid material transparent to visible light and having a refractive index $n_1$ dispersed in a second non-liquid material transparent to visible light and having a refractive index $n_2$, whereby $|n_2/n_1-$

|>0.1 and whereby the typical linear dimension, d, of the dispersed elements of the first material satisfies the condition 5 nm<d<300 nm, for example being between 10 and 200 nm, such as between 50 and 100 nm. In the case of a diffuser of large dimensions, an interval of interest for the typical linear dimension, d, of the dispersed elements is 30 nm<d<50 nm. This material is capable of producing efficient separation between components with lower wavelength of the incident radiation, which are scattered, and those with higher wavelength, which are instead transmitted.

In the chromatic diffuser according to an embodiment, the dispersed elements of the first material may be:
  solid nanoparticles with refractive index $n_1$ in the case in which the second material is a solid matrix with refractive index $n_2 < n_1$.
  gas nanobubbles with refractive index $n_1$ in the case in which the second material is a solid matrix with refractive index $n_2 > n_1$.
  nanovolumes of air in the case in which the second material is constituted by a solid dendritic structure of ultra low density silica, in turn composed of clusters of nanoparticles, which in the presence of the aforesaid dispersion takes the name of nanogel or aerogel.

Possible examples of chromatic diffusers of this type are silica nanogels, or a dispersion of a material with a high refractive index, such as an oxide like $TiO_2$, $ZnO$, $ZrO_2$, $BaTiO_2$, $Al_2O_3$, $SiO_2$, as described in U.S. Pat. No. 6,791,259 B1, just as some of the materials listed in WO 02/089175, which are incorporated by reference in a matrix of transparent material with a low refractive index, such as glass, plastic or polymer material such as epoxy, silicone or urea resins, or a dispersion of air bubbles of nanometric dimensions in similar transparent matrices.

"Diffuser dimension" is intended as the larger size between transverse dimension and longitudinal dimension, as defined above.

Figure 4:
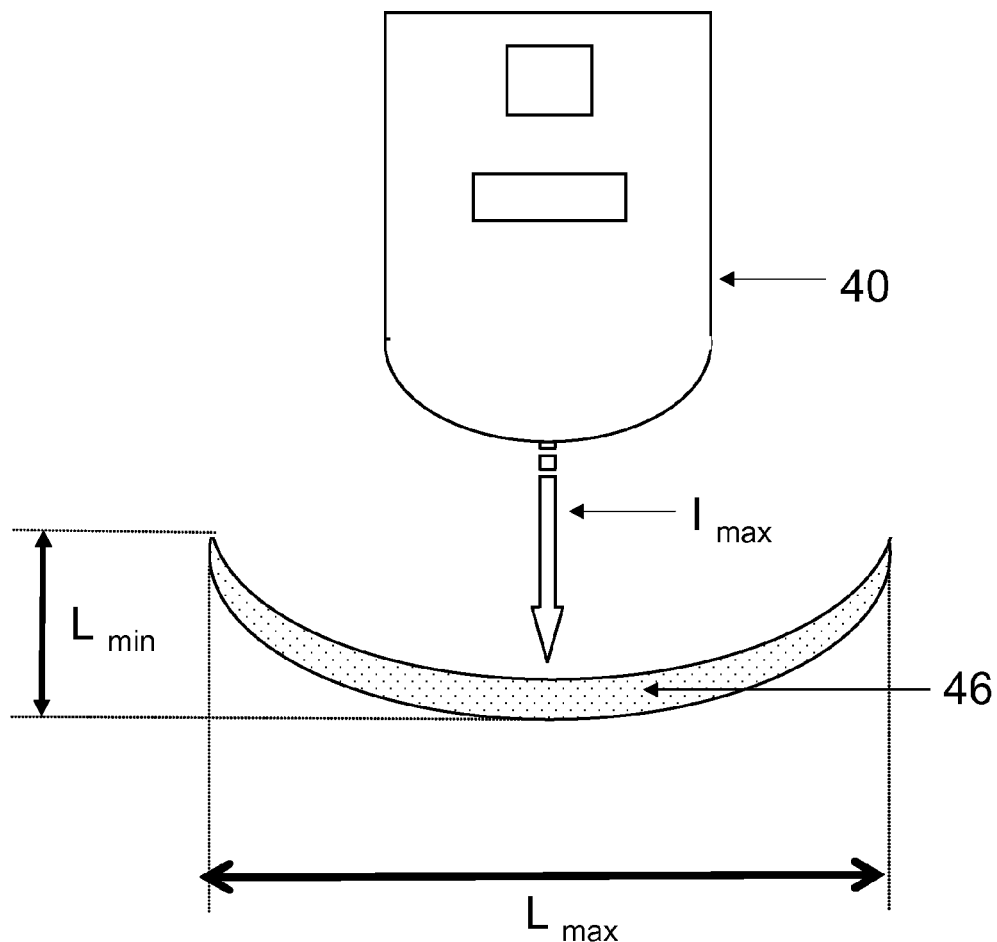
FIG. 4 illustrates the definition of dimension of the diffuser according to an embodiment.

FIG. 4 illustrates the definition of $L_{max}$ as "transverse dimension" of the diffuser in the case of an anisotropic emission source, 40, combined with a curved diffuser 46. In this case the maximum distance $L_{min}$ between two points belonging to the projection of the diffuser in a plane parallel to the direction $I_{max}$ is less than the maximum distance between two points belonging to the projection of the diffuser in a plane perpendicular to the direction $I_{max}$, therefore $L_{max}$ is defined as "transverse dimension" of the diffuser.

A device according to an embodiment may be characterized in that $L_{max} \geq 5\ d_{min}$, for example in that $L_{max} \geq 10\ d_{min}$. Generally, a device according to an embodiment may be characterized in that $L_{max}$ is in the interval between 2 and 100 $d_{min}$.

An embodiment of a device proposed is devised (i) for indoor illumination, such as apartments, offices, warehouses, shopping malls, work environments, theatrical scenery, (ii) for outdoor illumination such as roads, squares, sports grounds, parks, courtyards, (iii) for illuminating exhibited objects, such as plastics, products in display windows, and (iv) as separate luminous objects, for example a furnishing lamp or outdoor luminous installation.

A characteristic thereof is being able to improve the quality of the lighting that may be obtained by low energy "cold light" sources, such as InGaN—GaN LEDs emitting in the blue region (e.g. at 430 nm) completed by the presence of a phosphor which emits broad-band radiation in the yellow region (e.g. around 580 nm). The resultant of the two color components is perceived by the eye almost as white light. However, the corresponding "color temperature" is much higher than that of sunlight, so as to make this type of source somewhat unsuitable for indoor illumination. An embodiment allows a large part of the blue component of the light to be directed towards the shadows, where it is pleasing to the eye, as it simulates the effect of skylight, directing the warmer component produced by the phosphor towards the areas exposed to direct illumination, so as to simulate "afternoon" sunlight.

The use of nanostructured transparent materials in applications inherent to treatment of the light is a solution currently considered in a growing number of technological spheres.

With reference to the use of the combination of artificial sources and Rayleigh diffusers obtained through aqueous dispersion of silica nanoparticles (SiO2), the innovative element is constituted here by the use of solid materials.

The characteristics of the materials and of the diffusers to be produced with these materials shall now be described in detail. The term "nanostructured diffuser material" refers in this context to a non-liquid material which exhibits spatial variations in the refractive index on scale lengths between 5 and 300 nm. The term "transparent" refers to the characteristics of the absorption spectrum of the material. The depth L of the material, in the direction of light propagation, depends on the type of application, and may vary from a few microns (for applications on optical microcomponents) to tens of meters (in the case of large installations).

The main characteristics which describe the properties of the material are the typical dimension of the nanostructure (or the dimensions if, as in the case of nanogels, fluctuations have different scale lengths) and the concentration, that is, the number of fluctuations per unit of volume. Hereunder, the material is described in terms of a homogeneous matrix and of a dispersion of nanoparticles with diameter d, intending in this case also to include nanogels.

Dimensions of the nanostructure. These allow, where necessary, efficient scattering in order to obtain the desired ratio between scattered and transmitted light, and therefore, for example, between luminosity of the areas "in shadow" and of the areas "in the sun", using minimum depths of diffuser. This efficiency is obtained maintaining the scattering process as much as possible in Rayleigh regime, in order to obtain the maximum color contrast or, more precisely, the maximum variation in Calibrated Color Temperature (CCT) between scattered and transmitted light. This implies, strictly speaking, the choice of nanoparticles with a diameter of less than 50 nm, that is, $d < \lambda/10$. In fact, when the diameter increases, there is a considerable decrease in the value of the ratio between scattering amplitude in the blue region ($\lambda$=450 nm) and, for example, in the red region ($\lambda$=630 nm). Considering, for example, the case of a dispersion of nanoparticles with refractive index $n_1$=2.7 in a uniform material with index $n_2$=1.5, it is obtained that in the regime of negligible multiple scattering, more specifically in the limit of a very small number of particles, $\tau_{450}/\tau_{630}$=3.86, 3.95, 3.68, 1.56, 0.63 for nanoparticle diameters d=20, 50, 100, 200, and 500 nm, respectively, where $\tau_\lambda$ is defined as the scattered fraction of light at a given wavelength $\lambda$ [H. C. van de Hulst, "Light Scattering by Small Particles", Dover Publications, New York 1981, which is incorporated by reference]. Moreover, as the diameter increases, the scattering efficiency becomes anisotropic, increasing at small angles (forward scattering). However, as it increases with the 6th power of the particle diameter, $\tau \propto d^6$, given the same numerical concentration, it is evident that large diameters make the scattering process much more efficient. It is therefore necessary to evaluate, case by case, the optimum compromise between efficiency and color contrast desired. Angle and frequency resolved measurements and numerical simulations show that for linear dimensions of the dispersed elements up to d≈100 nm, scattering varies little from the ideal Rayleigh regime. Values d≈200 nm instead imply a considerable variation. However, dispersed elements of these dimensions may be useful if wishing to simulate the effect of a sky with slight mist, that is, which scatters at small angles (i.e. from areas close to the sun) light with a certain whiteness. With regard to the minimum acceptable values for the linear dimension of the dispersed elements, it must be mentioned that in the literature values d<20 nm are already considered such as to make the scattering phenomenon almost negligible, for the material depths typically considered. For example, in US 2008/0012032, which is incorporated by reference where the use of a dispersion of nanoparticles in a transparent medium is considered in order to vary the average value of the refractive index of the composite material, the requirement to prevent scattering translates into a requirement on the diameter of the nanoparticles d<$\lambda$/20, where $\lambda$ is the wavelength of the incident radiation. Considering the fact that the decrease in scattering efficiency in relation to the decrease in the linear dimension of the dispersed elements may be compensated by the increase in the concentration of these elements and/or in the depth of the diffuser, it is established that the linear dimension of the dispersed elements, d, useful for practical purposes for an embodiment is within the interval 5 nm<d<300 nm, bearing in mind that an ideal interval is 50 nm<d<100 nm.

Concentrations and depths. The second quantity that determines scattering efficiency is the concentration of nanoparticles, the scattered fraction of light being proportional to the number of particles per unit of volume, $\tau \propto n$, for a fixed sample length and in the limit of low concentration. There are two factors which principally limit the maximum concentration value usable. The first is a conceptual limit, due to the fact that when the particles are at an average distance from one another of a few diameters, a fact that occurs for concentrations of over a few %, they start to organize themselves with a short range spatial order, giving rise to effects of interference which disturb the scattering process. A second limit, of practical type, relates to the possible occurrence of the phenomenon of clustering of the nanoparticles at high concentrations, due to the presence of a short range attractive potential. Owing to the dependence $\tau \propto d^6$, even a minimum percentage of clustered particles (large effective d) is capable of creating a dominating effect on the scattering process. In the case of materials with depths of a few mm, the concentrations required to obtain the desired scattering values are nonetheless very low. Considering, for example, the case of particles with refractive index $n_1=2.7$ in a transparent medium with depth L=5 mm and with refractive index $n_2=1.49$, to obtained scattering efficiency $\eta=0.5$ in the case of diameters d=20, 50, and 100 nm numerical concentrations of n=4.7286*$10^{14}$, 1.9368*$10^{12}$, 3.0263*$10^{10}$ particles per cm$^3$ may be necessary, which correspond to a fraction of volume of 0.1981%, 0.0127%, 0.0016%, respectively. If instead high concentrations are to be used, for example of 1% in volume, which may require high control of the manufacturing process of the diffuser material in order to avoid clustering, the same efficiency value ($\eta=0.5$), may be obtained for the same diameters (d=20, 50 e 100 nm), using diffuser depths up to only a few microns, i.e. 990 µm, 63 µm, and 7.92 µm respectively. This indicates the possibility of producing the technology described, in certain regimes, also in thin films.

Absorption. The material absorbs a minimum part of the total incident radiation, in order to maintain maximum efficiency of the device in terms of energy consumption. Moreover, it does not exhibit selective absorption in any particular region of the visible spectrum, in order not to introduce unnatural and, therefore, undesirable color effects. For example, selective absorption in the blue region may reduce coloration of the shadows, while selective absorption in the red region may make the color of light in directly illuminated areas less "warm".

Reflection. Reflection of the light of the source on the entry and exit face of the diffuser may represent a drawback in relation to the energy efficiency of the device. In the case of a matrix with index $n_2=1.5$, this amounts to around 8% for normal incidence, but the value increases considerably in relation to increase in the angle of incidence, for non polarized light. It is noted that the problem also exists for nanogels, despite the fact that for these $n_1=1$, as due to their fragility they may require to be contained in a transparent element. As well as the problem of efficiency, the problem of the quality of the illumination produced is also considered. In fact, in nature the pureness of the colors of the sky and the beauty of the color contrasts between light and shadow are closely linked to the presence of a dark background (interstellar space) behind the sky. Indoors, it may be, therefore, essential to prevent the light of the source reflected by the diffuser from illuminating walls (e.g. ceilings), from which it would then be redirected onto the scene. In an embodiment the problem of reflection, in cases in which it exists, may be solved either by introducing light absorbing screens or, where efficiency of the device is a crucial parameter, using appropriate anti-reflective treatments.

A sector of particular interest is the "aerogel or nanogel" sector. In spite of their name, these are solid materials, dry (with no liquid content), spongy and porous, typically obtained through supercritical evaporation in autoclaves of the liquid component of a gel (or of a liquid substituted for this after formation of the gel). Unlike conventional evaporation, this process maintains unchanged the structure of the solid component of the gel, which forms a rigid foam with ultra-low density. In fact, over 99.8% of the volume of the final material may be occupied by air. The material thus produced presents a microscopic dendritic structure, with fractal characteristics, formed by nanoparticles with typical diameter of 2-5 nm, grouped in clusters spaced apart from one another by voids, said voids which may have average dimensions of less than 100 nm. The first aerogels to be developed, and which are still the most widely used, are those obtained from silica gel ($SiO_2$). However, aerogels obtained from other materials exist, such as aluminum oxide, chromium oxide, tin dioxide, carbon oxide, etc. In spite of the extremely low mass, the material presents considerable characteristics of rigidity, so much so that it is used in space technologies, for sporting equipment, etc. Limiting analysis to silica aerogels, of greater interest for the lighting applications inherent to an embodiment, it is transparent (that is, it absorbs a minimum quantity of light), and scatters part of the blue component by Rayleigh scattering. In fact, the nanostructure of which it is constituted has two typical length scales: that of the clusters of nanoparticles and that of the voids between these clusters, which may both be well below the wavelength of the light. For this reason aerogels are also called "solid smoke" in jargon. Due to their transparency, optimal heat insulation and also their capacity to scatter light, silica aerogels are today also used in building, to produce rooflights and windows capable of blocking heat from sunlight, or of retaining heat in the building, and at the same time of very effectively distributing the sunlight that hits them on the inside. For these applications aerogel granules are principally used, that is, fragments a few millimeters thick, contained inside windows of transparent material. The use illustrated may be capable of producing a blue coloration of the shadows. With reference to an embodiment proposed here, it may be important to observe that the use of aerogels for illumination with artificial light has not been considered previously.

As it has been stated above, the illumination device of an embodiment proposes an object contrary to the typical object of prior art illumination devices, that is, to make a source (which is typically, but not necessarily, chromatically uniform) chromatically non-uniform, with a type of non-uniformity (scattered blue and transmitted yellow) converse to that generated "spontaneously" by fluorescent LEDs. A characteristic of a device of an embodiment is to provide a nanodiffuser much larger than the last active element (for example phosphor), and position it downstream of this active element, for example separated therefrom. This difference in dimensions, positioning and spatial separation between source and diffuser are the factors that break the "spherical" symmetry of the system, with the aim of uniforming angular distribution of the colors, so as to allow separation of the two scattered (blue) and transmitted (yellow) color components, as can be understood from the descriptions of the different embodiments illustrated hereunder.

Embodiments of the Illumination Device in "Midday" Configuration

Figure 5A:
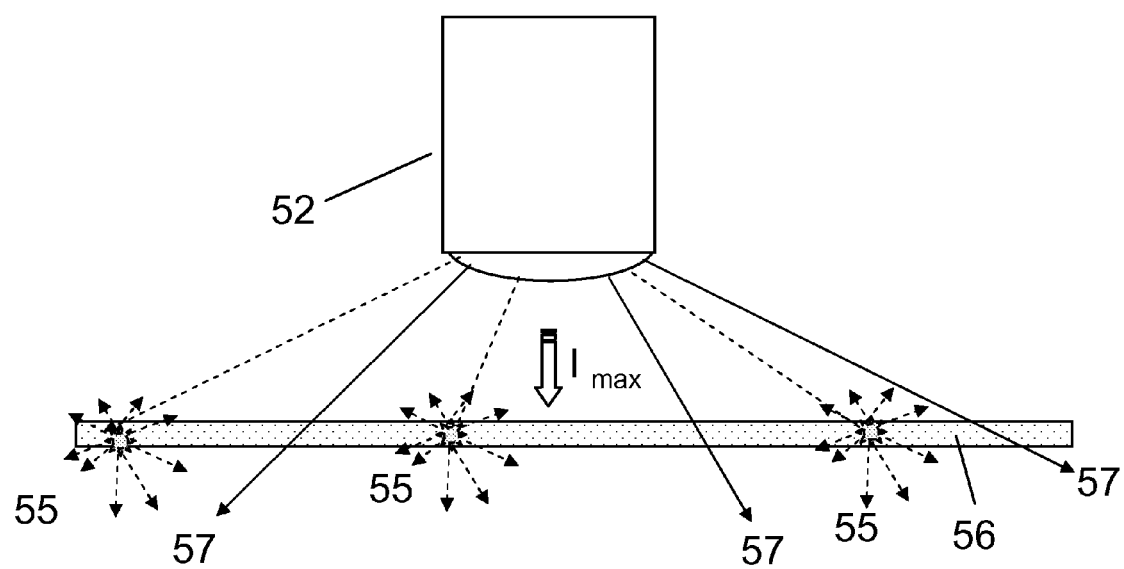
FIGS. 5A-5E schematically illustrate a first embodiment of the illumination device.
Figure 5B:
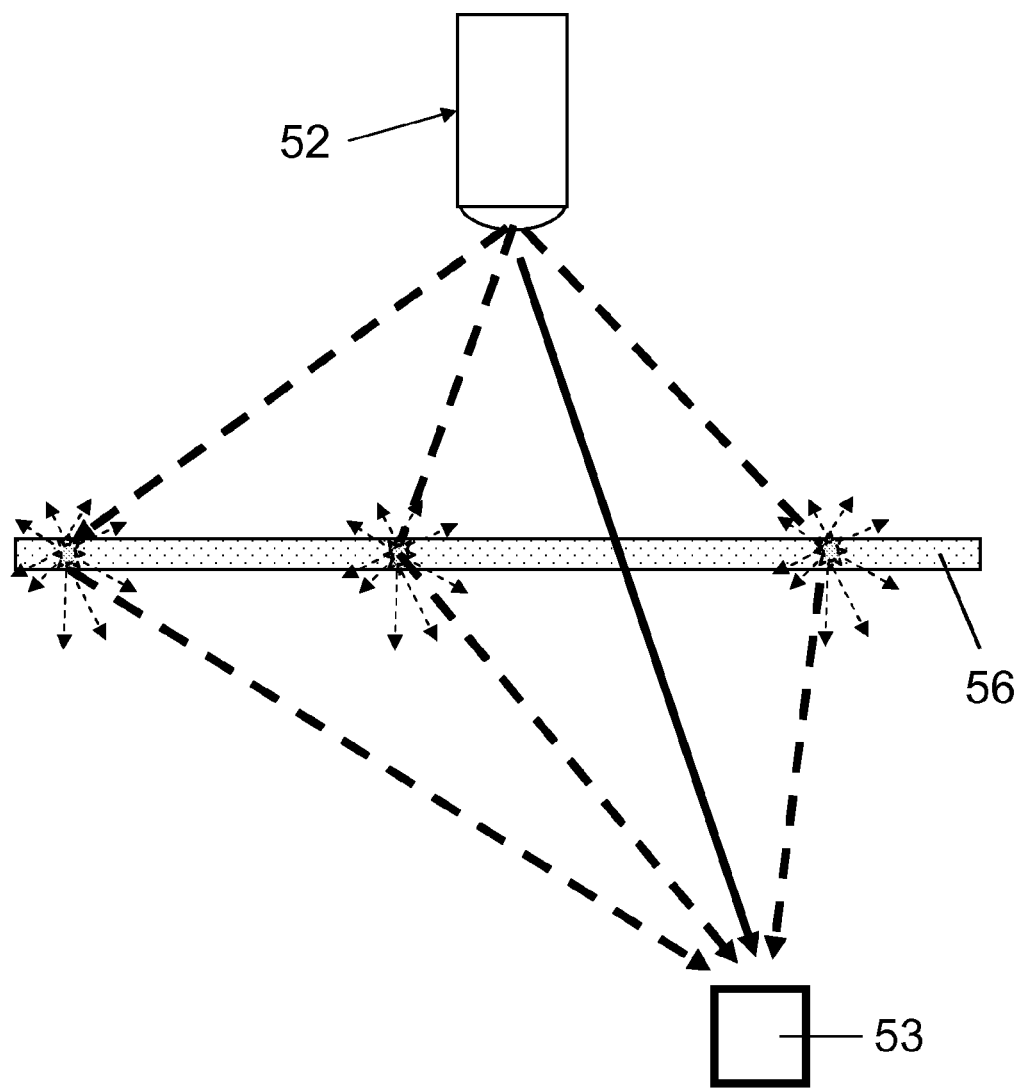
Figure 5C:
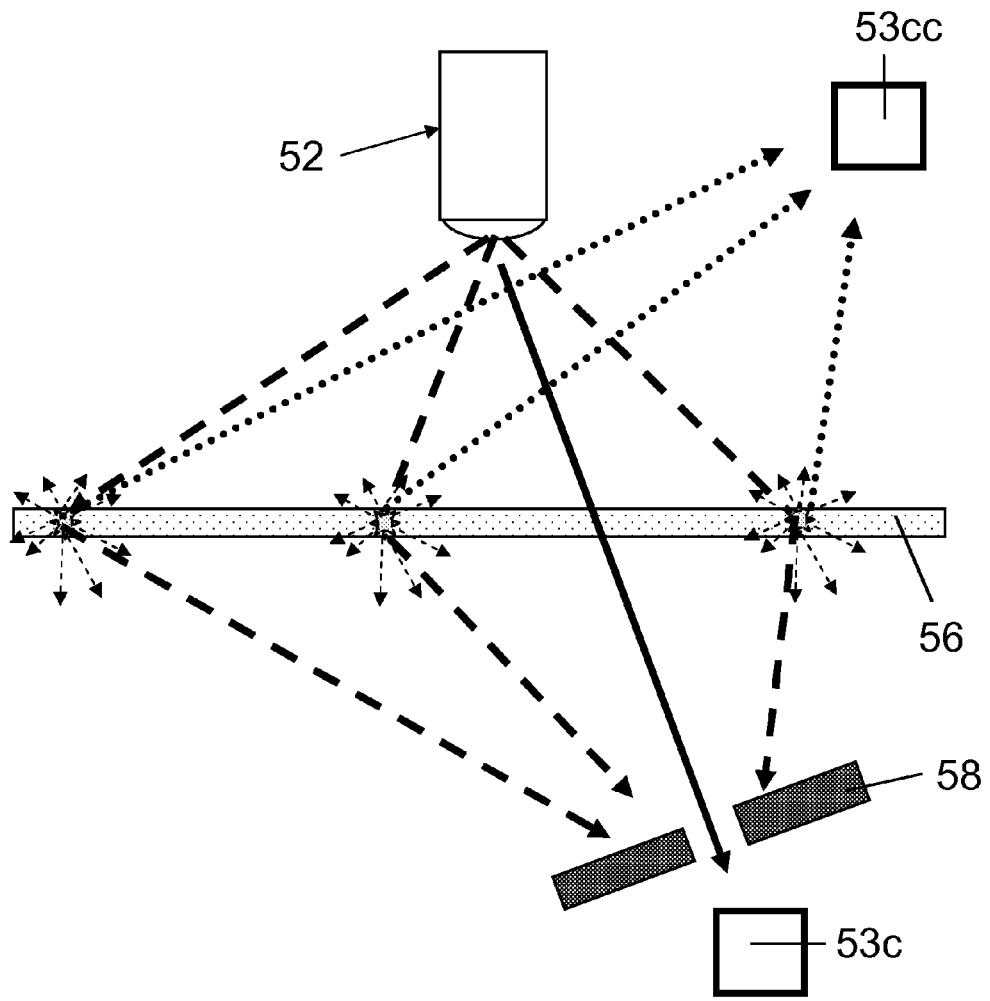
Figure 5D:
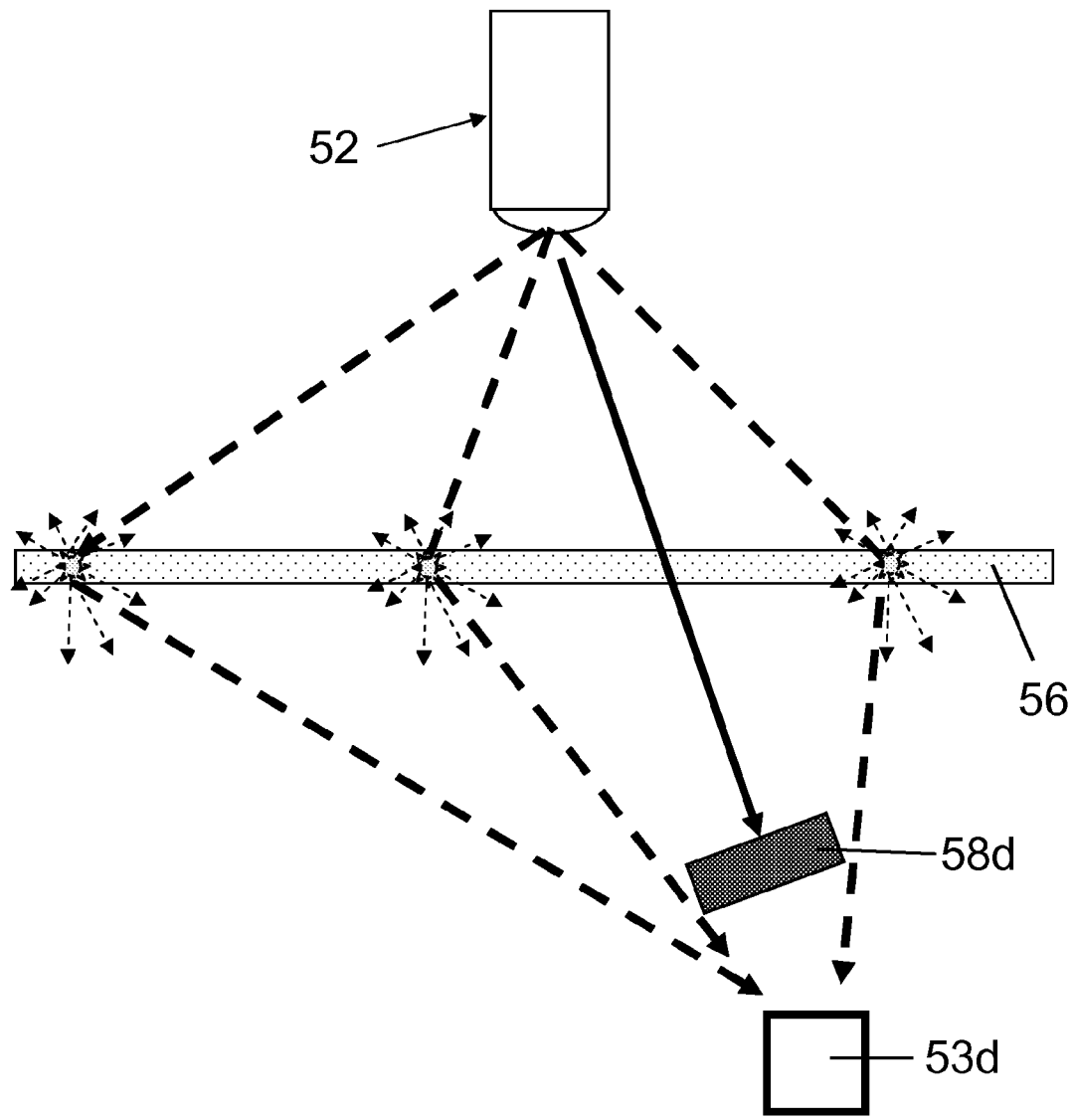

A first example of device according to an embodiment is illustrated in FIG. 5A, where an anisotropic source of white light 52 emits light of uniform spectrum over a wide solid angle, illuminating the nanodiffuser element 56 subtending this angle. In the presence of the nanodiffuser, the yellow component 57 is scattered less than the blue component 55. The result from the viewpoint of method of illuminating an object on the scene is illustrated in FIGS. 5B-D. In FIG. 5B an object 53 is illuminated both by direct light (yellow) and by the light scattered by the panel (blue); in FIG. 5C an object 53c is illuminated principally by direct light (yellow), in this case being provided with a screen 58 which removes the majority of the light coming from the diffuser panel 56, while object 53cc is illuminated only by the light back diffused (blue) from the diffuser panel 56; finally, in FIG. 5D an object 53d is illuminated principally by the scattered light (blue), as the direct light is removed by a screen 58d which generates shadow on this object.

Figure 5E:
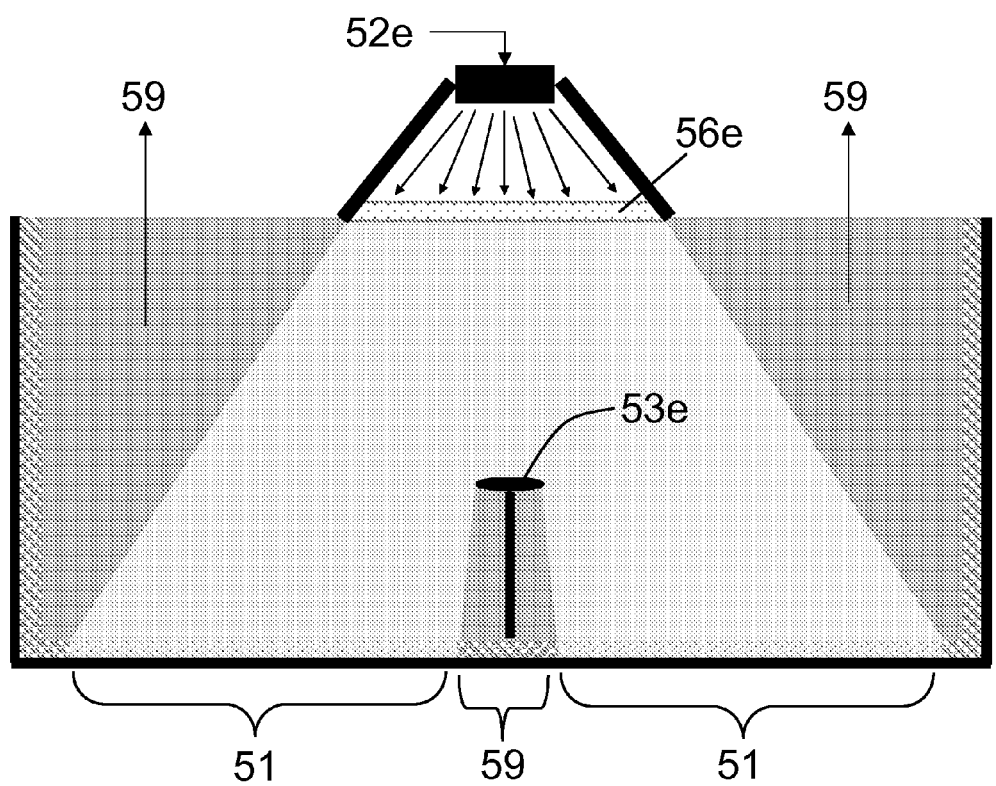

The effect in the case of illumination of an environment by means of a source 52e combined with a diffuser 56e is shown in FIG. 5E. Here the scene is partly illuminated by the sum of direct and scattered light 51 and partly only by scattered light 59. It is noted that the area illuminated by scattered light 59 comprises the shadow of an object 53e located in the center of the scene. It also comprises an outer area which would not be illuminated by the light cone produced by the source in the absence of the diffuser element.

Figure 6:
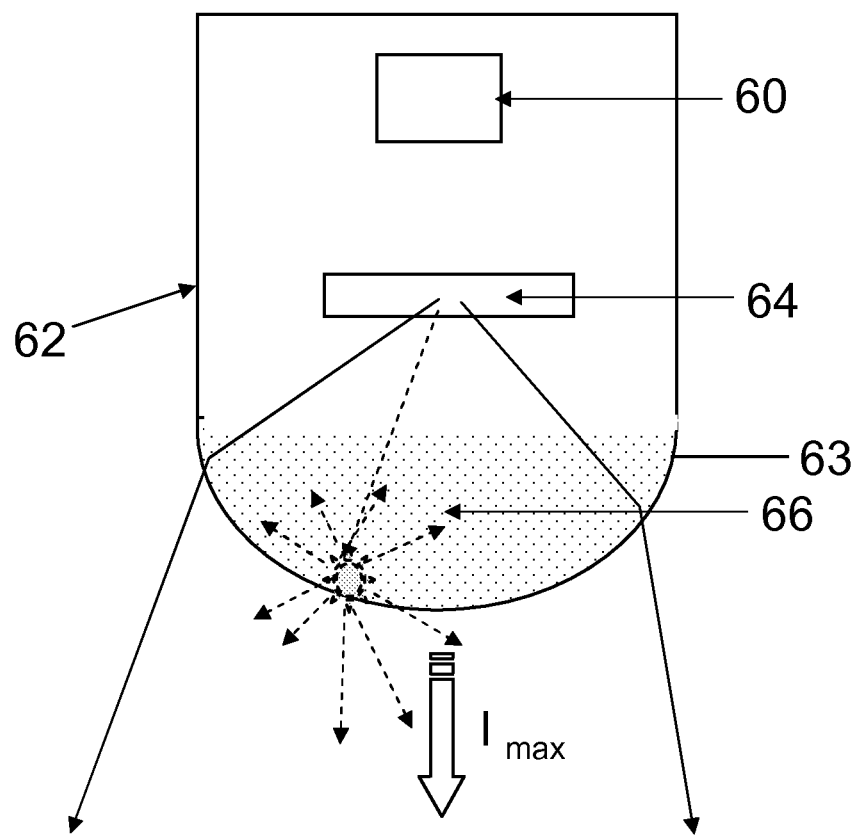
FIG. 6 schematically illustrates a second embodiment of the illumination device.
Figure 7:
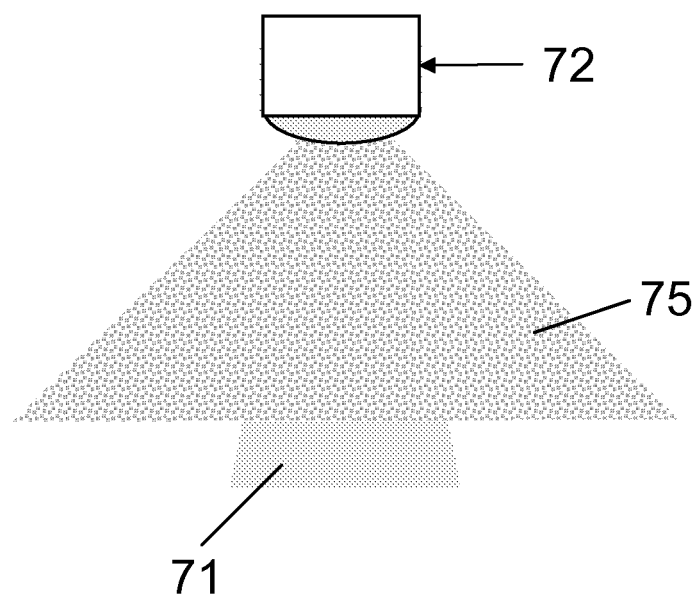
FIG. 7 schematically illustrates the type of illumination produced by the embodiment of the illumination device according to FIG. 6.

A second example of device is shown in FIG. 6, where an anisotropic source of white light is constituted by a blue LED or laser diode 60 associated with a phosphor 64 which emits in the yellow region. The source is incorporated in a transparent containing body 62, where the nanodiffuser 66 is incorporated in a collecting lens 63, forming the lower part of the transparent body 62. The lens 63 has the object of collimating the radiation generated by the source constituted by an LED or laser diode 60 and a phosphor 64, or of reducing the angle of divergence thereof. In the conventional configuration, i.e. in the absence of the nanodiffuser 66, the lens 63 would collimate the white light produced by the source, creating a cone of given angular divergence and of given transition gradient between light and dark. Conversely, the device 72 according to an embodiment, as shown in FIG. 7, produces a narrow inner cone of yellow light 71 and a wider cone of blue light 75.

Figure 8:
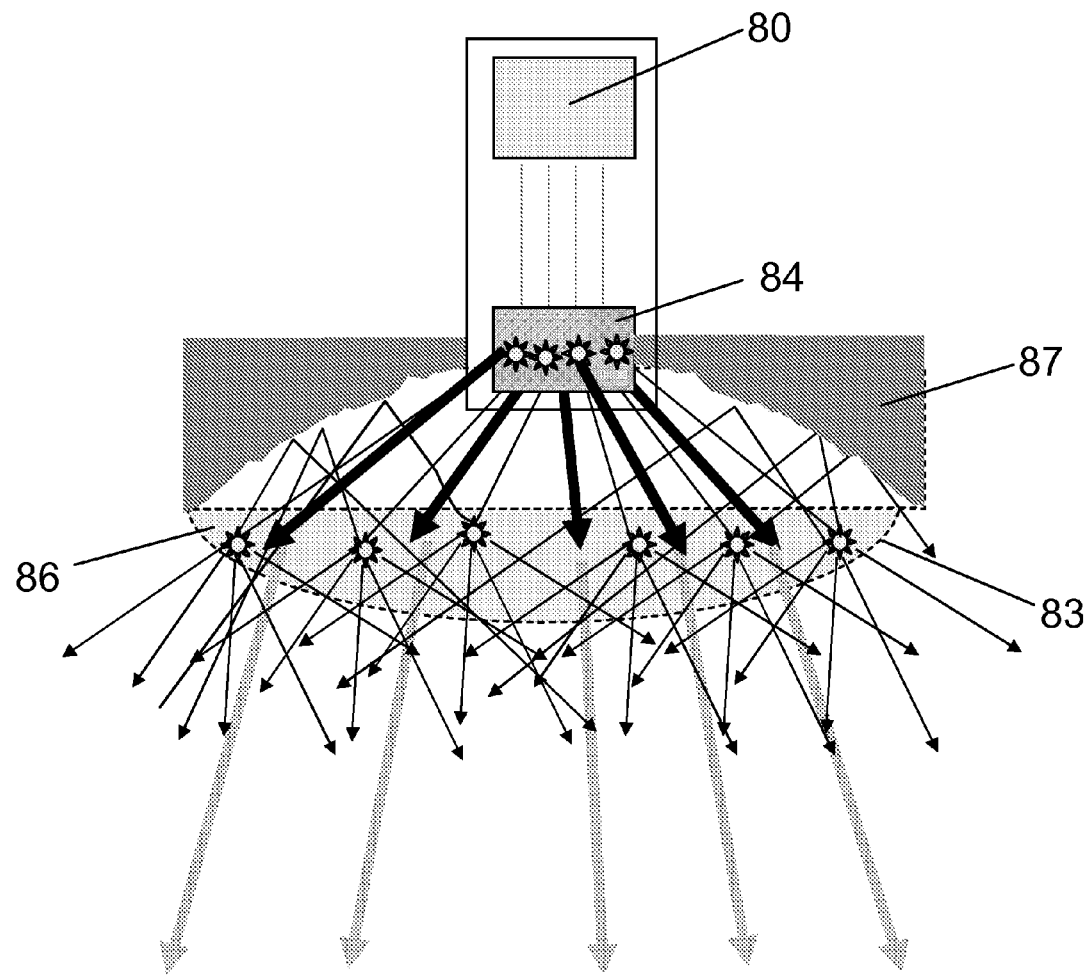
FIG. 8 schematically illustrates a third embodiment of the illumination device.

In a third embodiment shown in FIG. 8, two technical modifications are introduced, also separately, in order to improve the efficiency of the device. In the first the optical collimation element, i.e. the lens 83, is positioned at a certain distance from the source and separate therefrom. In this case, this lens, which contains the nanodiffuser 86, is provided with an anti-reflective treatment. An object of this treatment is to optimize transmission of the "warm" component of the radiation emitted by a source constituted, for example, by an LED or laser diode 80 and a phosphor 84, preventing reflections which could reduce the efficiency of the device and direct part of this component to the outer area, reducing the contrast. An object of the reflector is to retrieve the "cold" component back-scattered by the nanodiffuser element. In fact, in Rayleigh scattering regime, the scattering efficiency is identical in the two half-spheres which comprise the direction from which the light comes, and towards which the light propagates, which implies that a quantity of scattered light identical to that directed on the scene is directed back towards the lamp. One way of solving, or at least considerably reducing the problem is that of inserting the lens and the source inside a reflector 87 (whether spherical, parabolic or of different shape, with a smooth or corrugated surface) which re-directs the back-scattered light outward. As the scattered light is generated by an extended element and in random directions, the presence of a reflector in the vicinity of the diffuser does not greatly alter the divergence of the radiation coupled thereby on the outside. In the case in which the geometry of the system demands a considerable distance between lens and reflector, the use of corrugated surfaces for the reflecting walls ensures maintenance of the desired divergence in the scattered light.

Figure 9:
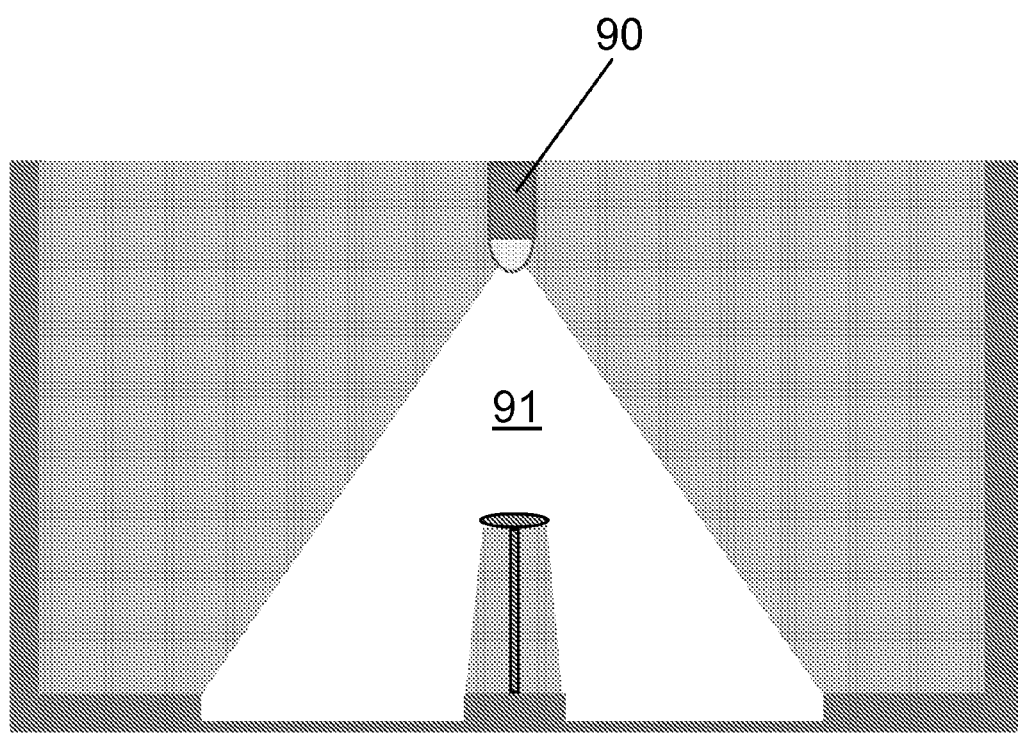
FIG. 9 schematically illustrates the type of illumination produced by an illumination device according to prior art.
Figure 10:
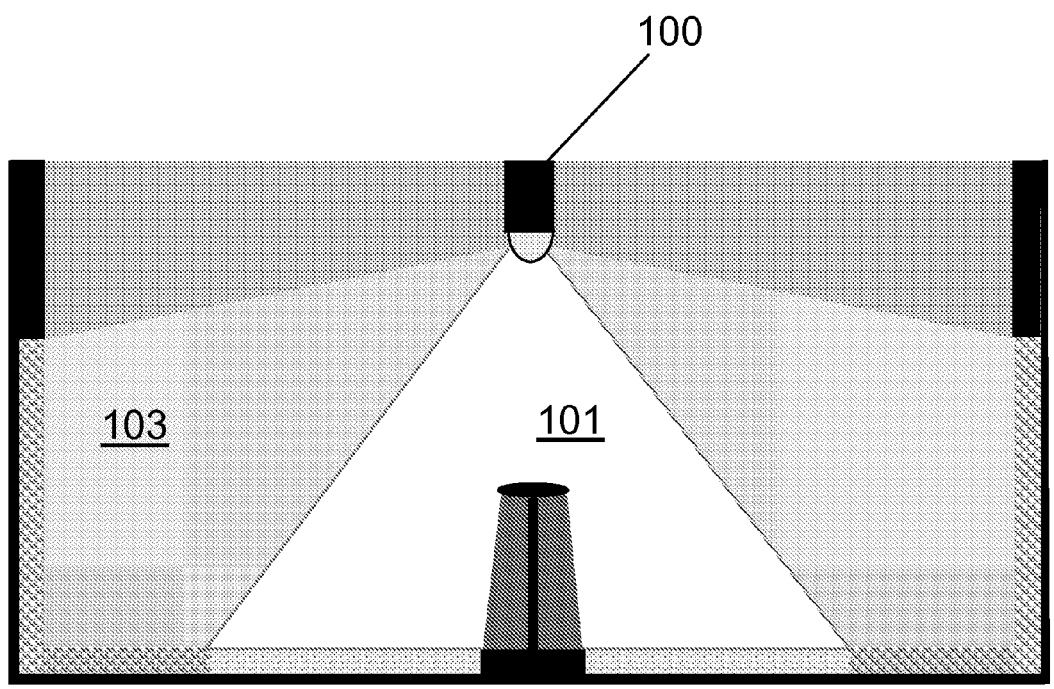
FIG. 10 schematically illustrates the type of illumination produced by an illumination device according to an embodiment in the form described in FIGS. 6 and 8.

A schematic example of the type of illumination obtainable with an embodiment of a device proposed here may be understood from the diagrams presented in FIGS. 9 and 10. In the first case, a conventional spotlight 90 illuminates with a defined cone of white light 91 a particular region of an environment, leaving the rest in the dark. In the second case, a spotlight 100 according to an embodiment, for example of the type shown in FIG. 8, generates a "warmer" light cone 101 than the cone of "white" light of the preceding figure, of the same aperture, having removed therefrom the "colder" component, which is distributed in the outer cone 103. The outer regions of the environment, which were previously in the dark, are instead now exposed to scattered blue light, as occurs in the case of shadows in outdoor environments on Earth. It may be important to observe that the terms "blue" and "yellow", or "cold" and "hot" referred to light, are only indicative, and used in order to symbolically indicate a concept. The quantitative parameter that determines the characteristics and therefore the "quality" of the device is the previously described "calibrated color temperature" (CCT). Measurements taken using a nanodiffuser of nanogel material with a depth of 12 mm and a blue LED with yellow phosphor with CCT=5296K, produced for the transmitted "warm" component a value of CCT=4334K, corresponding to a typical value for direct sunlight in the early afternoon, and for the scattered "cold" component a value of 9433K. The results are shown in FIG. 16.

Measurements taken using a nanodiffuser of PMMA/$TiO_2$ material with a depth of 12 mm and a blue LED with yellow phosphor with CCT=5296K, produced for the transmitted "warm" component a value of CCT=4417.9K, corresponding to a typical value for direct sunlight in the early afternoon, and for the scattered "cold" component a value of 7447.2K. The results are shown in FIG. 17

Figure 16:
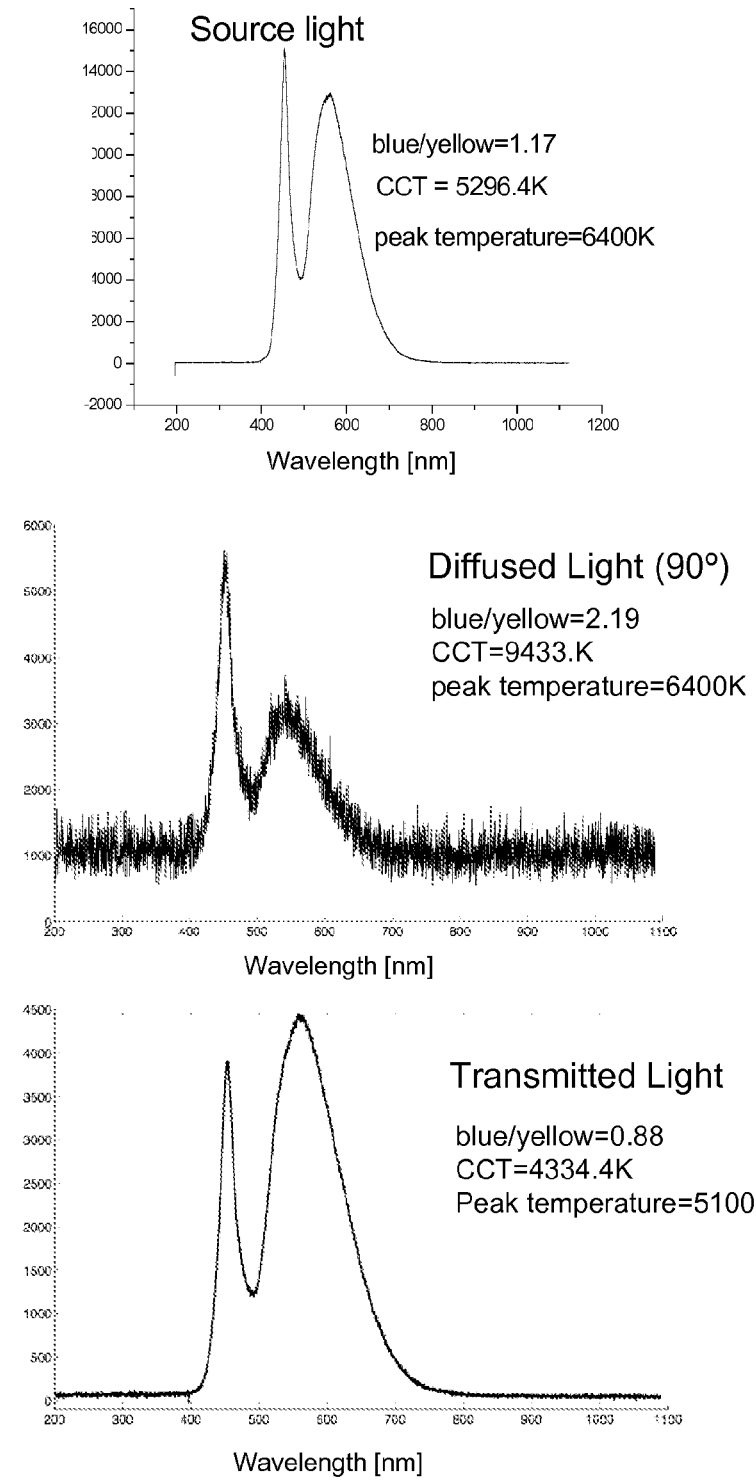
FIG. 16 is a diagram relative to the spectral characteristics of the radiation scattered and transmitted by a "nanogel" diffuser material employed according to an embodiment.
Figure 17:
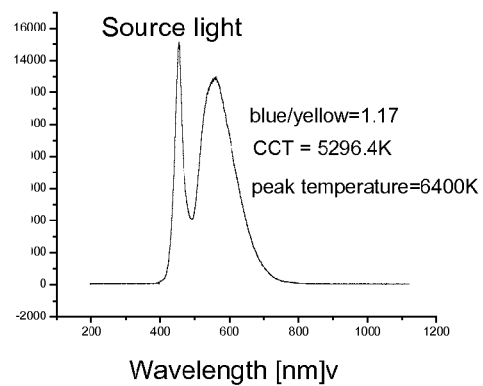
FIG. 17 is a diagram relative to the spectral characteristics of the radiation scattered and transmitted by a PMMA/TiO$_2$ nanocomposite diffuser employed according to an embodiment.
Figure 17:
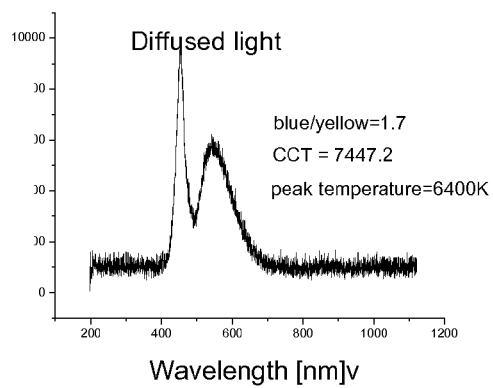
Figure 17:
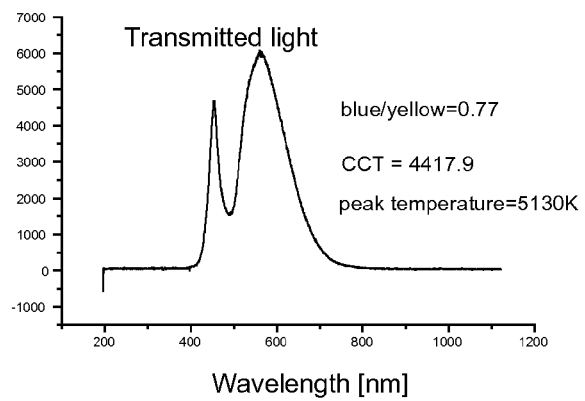

From the data in the FIGS. 16 and 17 it is evident that the decrease of the blue peak associated with the LED which is obtained in the transmitted component as a result of Rayleigh scattering makes the spectrum of this component, which is the one that illuminates the scene directly, much more similar to the bell-shaped profile of the black body spectrum, thus making it more similar to that produced by direct sunlight.

Figure 11:
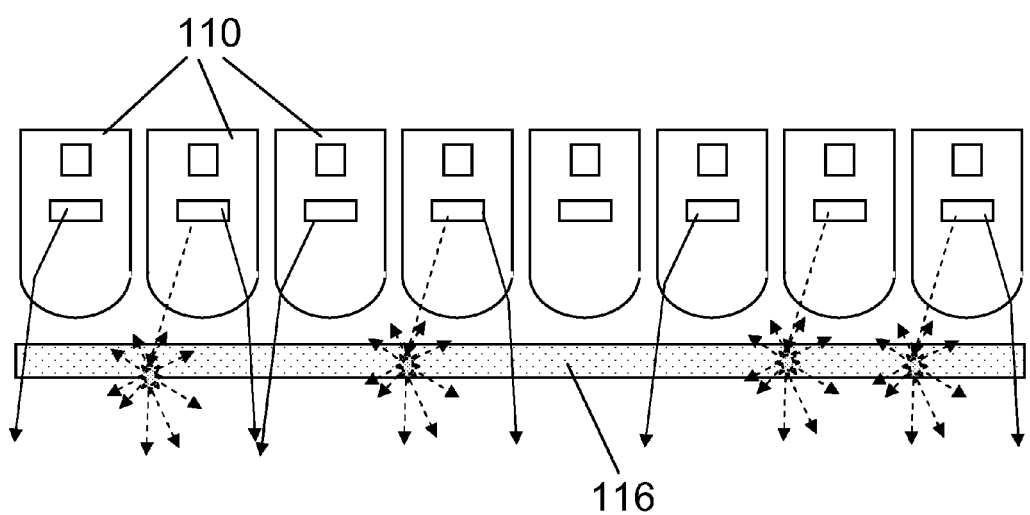
FIG. 11 schematically illustrates a fourth embodiment of the illumination device.

In a fourth embodiment of FIG. 11 a plurality of light sources were used, designated with 110, positioned downstream of which is a nanodiffuser 116.

The type of device shown in FIGS. 6 and 8 is not limited to the use of LEDs or laser diodes, but may make use of any type of light source characterized by a sufficiently broad spectral bandwidth. The device is suitable for indoor illumination, such as hotel rooms, or study areas in apartments, etc., that is, all those environments in which lighting of only one area is preferred, or to create a scenographic effect, or to reduce consumption. A second area of interest is that of road illumination, which would benefit from the possibility of preferentially illuminating an area in direct light (for example the road), with a spectral component (for example yellow) where the eye is particularly sensitive, maintaining a weaker and more scattered illumination in the surrounding areas. All this with the natural coloration of sunlight and skylight.

Embodiments of the Illumination Device in "Sunset" Configuration

Figure 12A:
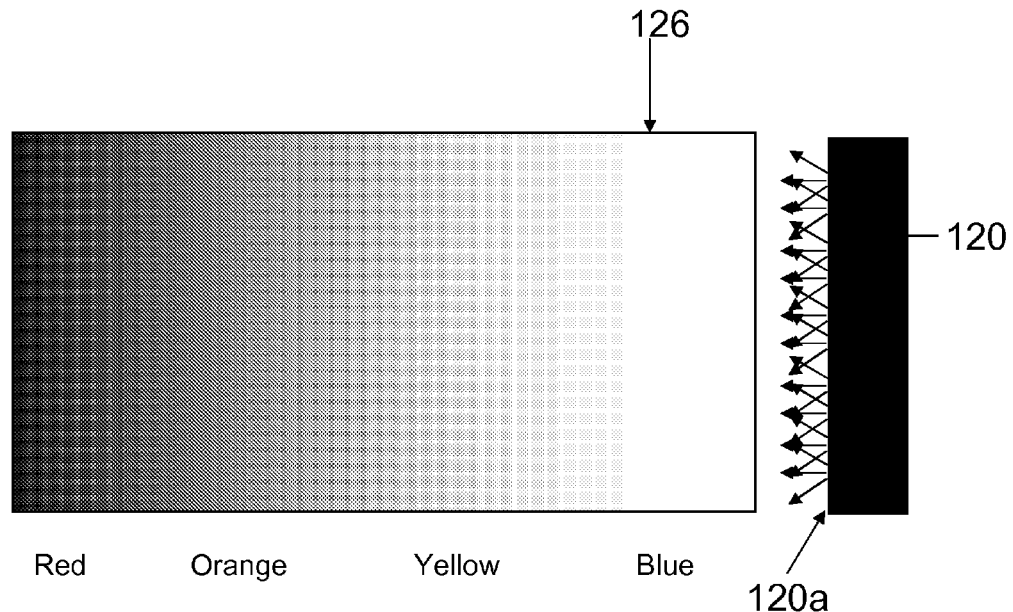
FIGS. 12A, 12B, 12C schematically illustrate a fifth embodiment of the illumination device.
Figure 12B:
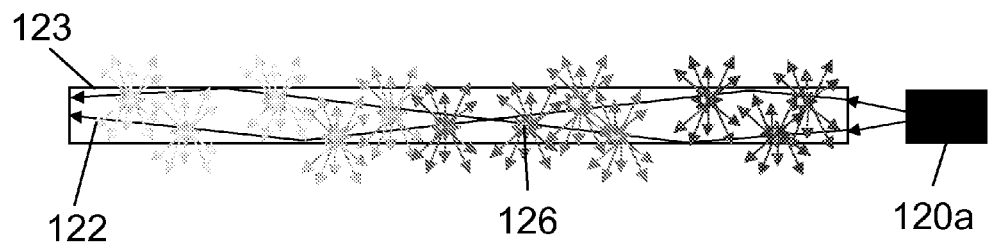

An example of device according to an embodiment in "sunset" configuration is shown in FIGS. 12A and 12B, where a white light source 120, constituted by a plurality of white light LEDs or laser diodes (for example, UV LEDs or laser diodes combined with phosphors of different colors, or combinations of LEDs or laser diodes which emit in the red, in the green and in the blue region) of the type shown in FIG. 11, is schematically produced in the shape of an elongated parallelepiped. FIG. 12A shows the source 120 in a side elevation, while FIG. 12B shows the source 120 in a top plan view. The source 120 is contained in a transparent structure on the side 120a, from which the radiation emitted is directed towards a nanodiffuser 126. The source, appropriately collimated in the horizontal plane, sends the broad-band light produced thereby inside the nanodiffuser 126. This diffuser is configured as a panel whose length in the direction of propagation of light is much greater than its depth. The height of the nanodiffuser panel may have different values according to different needs. In order to allow the light transmitted to propagate inside the entire length of the panel, in spite of the fact that it may be very thin, it may be important for it to act as a waveguide, that is, not to couple transmitted light on the outside (or to couple a minimum part thereof) in the absence of the dispersed elements. In other terms, the diffuser element without the nanostructure is such that it does not couple light on the outside. A method of achieving this objective is to use, as the diffuser material, a dispersion of nanoparticles in transparent vitreous, plastic or polymer material, whose refractive index $n_2 \approx 1.5$, being greater than the refraction index of air ($n_{air} \approx 1$), provides a limit angle for internal reflection, with respect to the normal of the surface, of $\theta_{lim} \approx 42$ deg. For this reason, the panel of transparent material without nanoparticles incorporated acts as an excellent waveguide, capable of transmitting from one part to the other the light of the source by total internal reflection, as shown by the lines 122 and 123. In the presence of nanoparticles, the light scattered thereby at $-42$ deg$<\theta_{scat}<42$ deg is decoupled from the guide, so that it becomes visible to the observer, as shown in FIG. 12B. The light scattered at greater angles is instead coupled, to then be scattered if necessary in a subsequent scattering event. In this manner, the portion of diffuser closest to the source scatters almost all the blue component; the subsequent portion will prevalently scatter the green, as this is the remaining component with the shortest wavelength, and will scatter it with a slightly lower scattering efficiency (given the greater wavelength) than that characterizing scattering of the blue in the previous region. This implies a decrease of luminosity progressively along the entire diffuser, until only the red radiation component remains, to be scattered in the end portion of the diffuser.

Figure 12C:
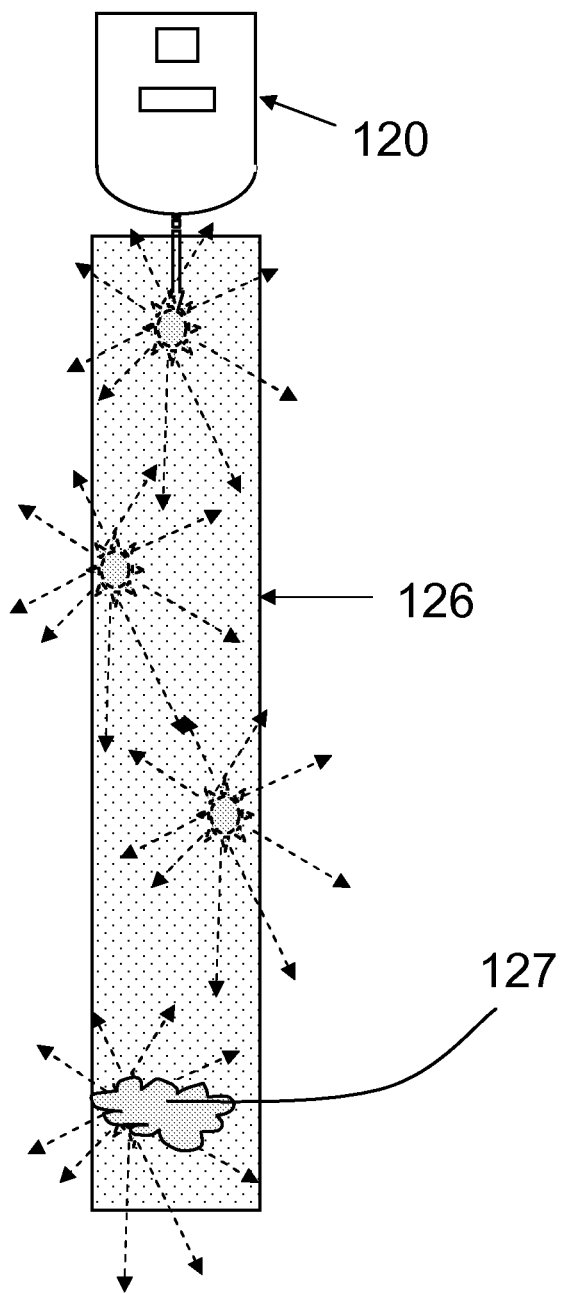

In a variant of this embodiment, shown in FIG. 12C, objects 127 may be incorporated in the nanodiffuser panel 126, for example white objects, capable of locally scattering all the components of incident light, and therefore simulating clouds. In another variant, panels of different length, or characterized by different scattering coefficients, may be placed side by side in the installation (in the direction of depth of the diffuser, i.e. in the direction of observation), in order to simulate the various scattering processes that take place at different heights in the atmosphere. This allows reconstruction, for example, of the fact that the low part of the atmosphere at sunset is invested by the orange or even red component of solar radiation, as all the other components have been scattered or refracted, while the high part of the atmosphere remains illuminated by the white light of the sun, and therefore scatters blue colored light towards us.

Figure 13A:
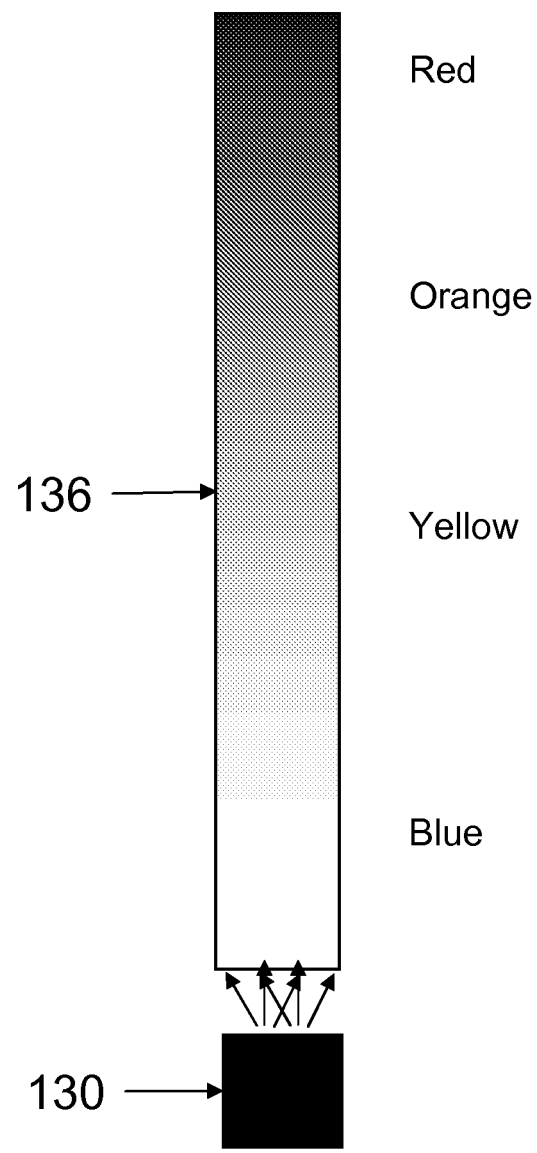
FIGS. 13A, 13B, schematically illustrate a sixth embodiment of the illumination device.
Figure 13B:
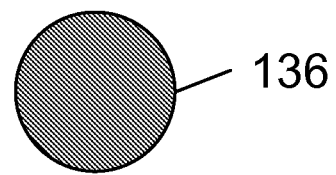

A further embodiment of an illumination device in "sunset" configuration is shown in vertical elevation in FIG. 13A and in a bottom plan view in FIG. 13B. In this embodiment, the nanostructured diffuser element 136 has the shape of a cylinder. The operating principle is the same as the previous case: a source 130 illuminates the cylinder from below (or, equivalently, from above) and the light, which propagates guided along the axis of the cylinder, scatters all the color components, starting from blue through to red. This device is intended as an indoor lamp, or, in the case of considerable dimensions, as an outdoor installation.

Figure 14A:
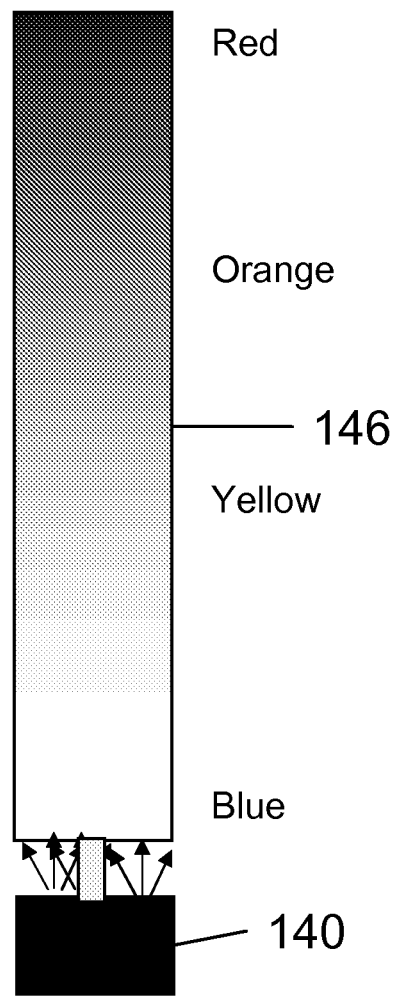
FIGS. 14A, 14B, 14C, 14D, 14E, 14F schematically illustrate further embodiments of the illumination device.
Figure 14B:
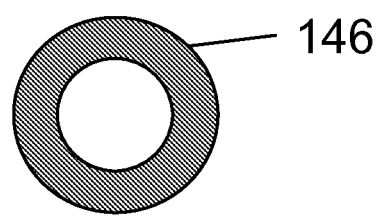
Figure 14C:
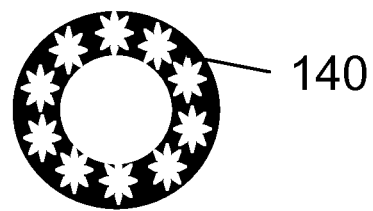

A further embodiment of the lighting device, susceptible of operating both in "midday" and in "sunset" configuration, is shown in FIGS. 14A, 14B, 14C, 14D, 14E and 14F. FIG. 14A shows in vertical elevation a light source 140 which illuminates from below a cylinder 146 of nanostructured transparent material similar to the previous one but perforated inside, as shown in FIG. 14B. The "solid" portion of the nanostructured cylinder 146 once again acts as a waveguide, if it is illuminated by a source placed at one end and which has the shape of a ring, as shown in FIG. 14C (viewed from above). In this operating mode the device acts to the view in an analogous manner to the device in FIG. 13, setting the scene with the colors of the sky at sunset, as shown in FIG. 14A.

Figure 14D:
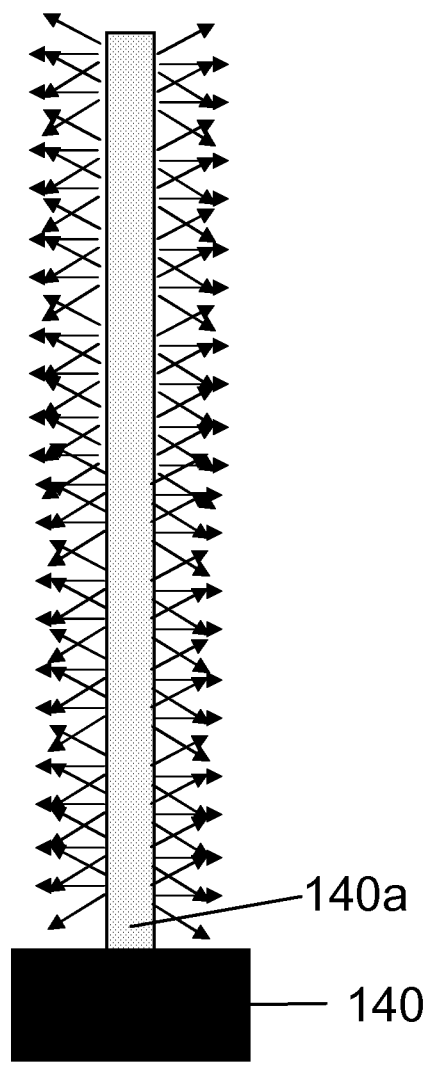
Figure 14E:
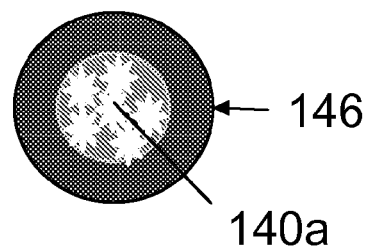
Figure 14F:
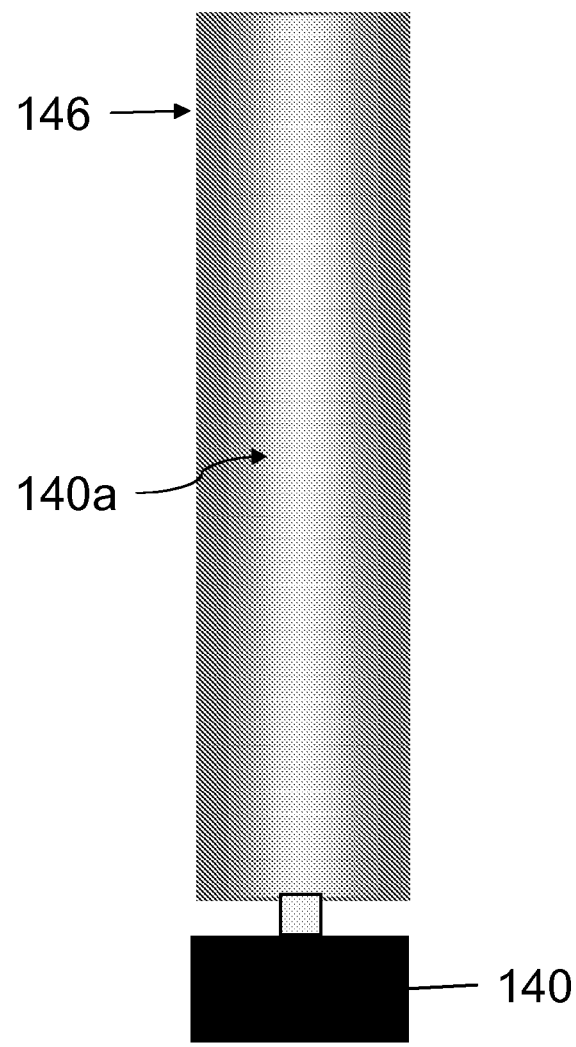

Unlike the previous case, FIG. 14D shows a light source constituted by a lamp of elongated tubular shape 140a, or a white diffuser cylinder illuminated from below, capable of generating white light which propagates outwards, designed to be inserted in the hole of the nanostructured diffuser 146, as shown in FIG. 14E, whose light is therefore also scattered by the hollow nanostructured diffuser cylinder. In the case of this second type of illumination, an observer positioned in front of the cylinder will see the inner luminous tube, which emits white light, without the scattered blue component. This luminous tube will therefore appear yellow, i.e. the color of the sun, as shown in FIG. 14F. With regard to the lateral parts of the cylinder, the observer will see the blue component of light generated by the central tube scattered towards him, that is, he will see the color and light of the sky. It is interesting to note that the observer will see the same distribution of colors regardless of his position with respect to the source, that is, from all sides. This fact will allow him to discover that the different colors are not linked to different colorations of the object, but are inherent to the difference existing between transmitted and scattered light. Other possible variants of the present embodiment provide for a structure with a square, rectangular or elliptical base. In this case, the lack of symmetry creates in the colors different tones according to the different visual angles. The two light sources 140 and 140a will be used alternatively to each other. Switching off the first source 140 and switching on the second 140a, the transition is made from the condition of sky at sunset to the condition of sky and sun at midday. The spectacular transition between daytime and evening scenery will reinforce the proof of the role played by the scattering processes in determining the color of light.

With regard to coupling of the light produced by the source with the panel in the embodiments with "sunset" configuration, it will be produced by installing appropriate optical elements, in the case in which the source or sources used do not have the desired angular divergence. A characteristic for optimizing coupling is that the source produces sufficiently low divergence in the direction of depth of the diffuser panel to allow guided propagation of the light in the material. The source, for example composed of a battery of LEDs or laser diodes, will also be extended in vertical direction, in the case of the device in FIG. 12A, in order to uniformly illuminate the entire extension of the panel 126, or circular, in the case of the device in FIG. 14A in order to illuminate the base of the tubular diffuser cylinder 146. With regard to the spectral characteristics of the source, it is noted that a source which is white to the eye, as it excites in an adequately balanced manner the three types of detectors (i.e. R. G. B), may be lacking important portions of the spectrum, in relation to that produced by a black body at the same CCT. This source may prove unsuitable for the purpose, as it is incapable of generating scattered light of the expected color in specific spatial portions of the diffuser, which would be dark. If we consider, for example, the case of a blue LED with phosphor emitting in the yellow region, it is evident that this source will not be able to create the bright red which is expected to illuminate the end part of the diffuser, so as to simulate sunlight illuminating the clouds at sunset, simply because the source does not have that spectral component. Ideal sources are therefore either those with black body spectrum, or those produced by appropriate combination of LEDs or laser diodes and phosphors of different colors. It is noted that, in the case of a combination of different sources, these do not necessarily require to be integrated in a single element, but may be simply positioned side by side, provided that this positioning is sufficiently compact not to be perceived as heterogeneity of colors scattered in the vertical plane of the diffuser.

A device according to an embodiment may be used as luminous furnishing object, capable of setting the scene with the beauty of the colors of the sky. In this case it is used as object to be observed, rather than as a source that illuminates a scene. However, it is possible to produce both functions in the case of a panel, or system of panels, of large dimensions, which cover, for example, the entire ceiling, or an entire wall of a room, or even several walls. In this case, the device may replace conventional illumination, providing, just as the sky, illumination scattered throughout the environment. An important advantage with respect to the type of illumination proposed in the previous embodiments is that in this case it is unnecessary to place any source behind the panel, at a certain distance, a fact that considerably reduced the dimensions.

Embodiments of the Illumination Device in "after Sunset" Configuration.

Figure 18:
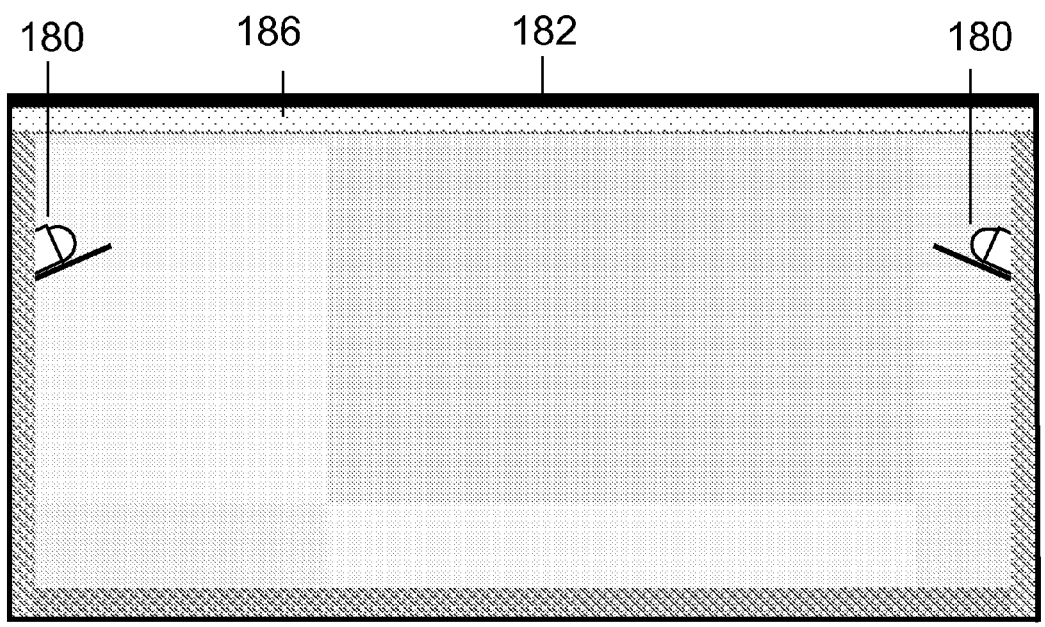
FIG. 18 shows an embodiment of a device in an "after sunset" configuration.

An example of device according to an embodiment the invention in "after sunset" configuration is shown in FIG. 18 where two white light sources 180, positioned at a height of ⅔ with respect to the total height from the floor to the ceiling, emit light of uniform spectrum at a certain angle towards the ceiling, illuminating the nanodiffuser element 186. Part of the light is back diffused by the chromatic diffuser 186 and uniformly illuminates the scene in a blue color. The light which passes through the diffuser element 186 is absorbed by a black panel 182 positioned behind element 186.

Figure 15:
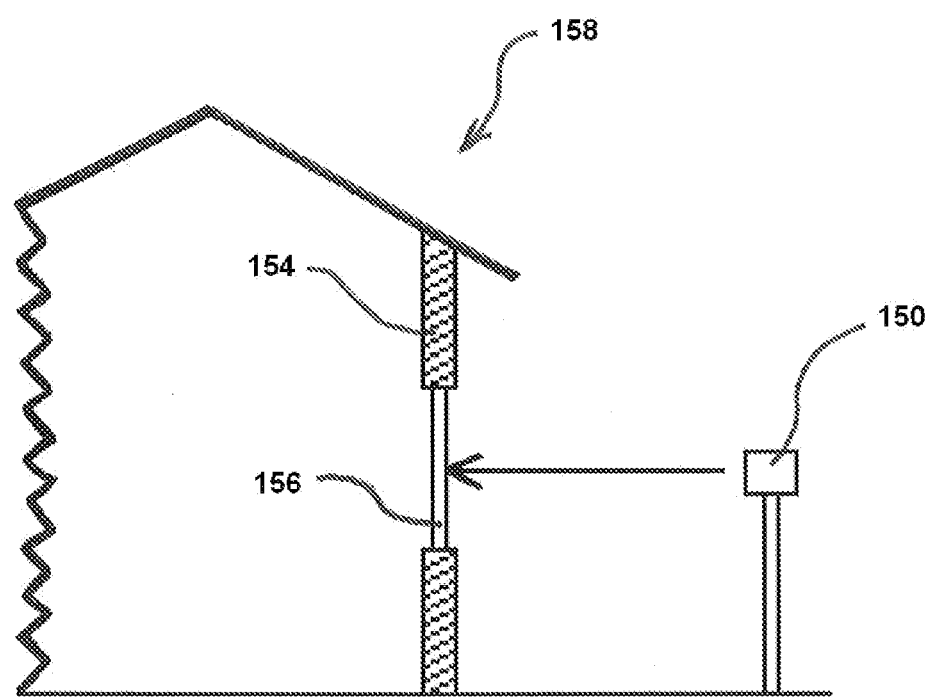
FIG. 15 shows an embodiment in which the light source and the chromatic diffuser are totally separated and spaced apart.

In a further embodiment, the light source is totally separated and spaced apart from the chromatic diffuser. In this case, the term "device" is to be meant as the combination of a light source and a chromatic diffuser, irrespective of whether they are structurally integrated or not. An example of such embodiment is schematically shown in FIG. 15, in which the chromatic diffuser is a panel 156 integrated in a wall of a building 158, and the light source is integrated within an external lamp 150, for example a street lamp. The chromatic diffuser may be incorporated in the structure of a window, and actually replace the glass(es) of a window. In such embodiment the space inside the building is illuminated according to the principles described above. In another example of such embodiment the chromatic diffuser is a panel 156 similar to the one in FIG. 15 integrated in a wall of a building 158, and the light source is integrated within a lamp positioned inside the building. In this case the space inside the building is illuminated by the light back scattered from the panel 156.

Some embodiments have been described, but it is evidently susceptible to numerous modifications and variants within the scope of the disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A chromatically non-uniform illumination device comprising:
    an artificial light source with a spectral bandwidth of at least 100 nm in the range of wavelengths between 400 nm and 700 nm, the artificial light source comprising one or more active elements which emit photons or which absorb photons and then re-emit photons at a higher wavelength; and
    a chromatic diffuser located downstream the artificial light source, which comprises elements of a first non-liquid material transparent to visible light, the elements of the first non-liquid material being dispersed in a second non-liquid material transparent to visible light, the typical linear dimension d of the dispersed elements of the first non-liquid material satisfying the condition 5 nm≤d≤300 nm;
wherein the chromatic diffuser is non-absorbent in the range of wavelengths between 400 nm and 700 nm, and a maximum dimension $L_{max}$ of the chromatic diffuser is equal to or greater than twice a minimum dimension $d_{min}$ of a projection of the largest of said active elements on a first plane perpendicular to a first direction, wherein said maximum dimension $L_{max}$ is defined as the greatest between:
    a transverse dimension, defined as the maximum distance between couples of points belonging to the projection of the chromatic diffuser on the first plane; and a longitudinal dimension, defined as the maximum distance between couples of points belonging to the projection of the chromatic diffuser on a second plane parallel to the first direction;

and wherein:

a. in case the artificial light source is anisotropic, said first direction is the maximum emission direction of said artificial light source; otherwise b. in case the artificial light source is isotropic, said first direction is defined by a straight line that joins the closest points of said artificial light source and chromatic diffuser.

2. The illumination device according to claim 1, wherein the dispersed elements of the first non-liquid material are solid nanoparticles with refractive index $n_1$, said second non-liquid material being a solid matrix with refractive index $n_2 < n_1$.

3. The illumination device according to claim 1, wherein the dispersed elements of the first non-liquid material are gas nanobubbles with refractive index $n_1$, said second non-liquid material being a solid matrix with refractive index $n_2 > n_1$.

4. The illumination device according to claim 1, wherein the dispersed elements of the first non-liquid material are nanovolumes of air, said second non-liquid material being formed by a solid dendritic structure of ultra low density silica, comprising clusters of nanoparticles.

5. The illumination device according to claim 1, wherein the chromatic diffuser is a panel having the shape of a parallelepiped, and the artificial light source is arranged on a smallest face of said panel.

6. The illumination device according to claim 1, further comprising a reflector, said artificial light source being arranged inside the reflector so that the reflector is configured to redirect light back-scattered by the chromatic diffuser towards the chromatic diffuser.

7. The illumination device according to claim 1, wherein said chromatic diffuser is structurally separated from said artificial light source.

8. The illumination device according to claim 1, wherein said chromatic diffuser is a panel integrated in a wall of a building.

9. The illumination device according to claim 1, wherein said first non-liquid material has a refractive index $n_1$, and said second non-liquid material has a refractive index $n_2$, and wherein $|n_2/n_1-1|>0.1$.

10. The illumination device according to claim 1, wherein the chromatic diffuser is integrated with a lens.

11. A chromatically non-uniform illumination device comprising:

an artificial light source with a spectral bandwidth of at least 100 nm in the range of wavelengths between 400 nm and 700 nm, the artificial light source comprising one or more active elements which emit photons or which absorb photons and then re-emits photons at a higher wavelength; and a chromatic diffuser located downstream the artificial light source, which comprises elements of a first non-liquid material transparent to visible light, the elements of the first non-liquid material being dispersed in a second non-liquid material transparent to visible light, the typical linear dimension d of the dispersed elements of the first non-liquid material satisfying the condition 5 nm≤d≤300 nm;

wherein the chromatic diffuser is non-absorbent in the range of wavelengths between 400 nm and 700 nm, and a transverse dimension of the chromatic diffuser is equal to or greater than twice a minimum dimension $d_{min}$ of a projection of the largest of said active elements on a first plane perpendicular to a first direction, wherein said transverse dimension is defined as the maximum distance between couples of points belonging to the projection of the chromatic diffuser on the first plane, and wherein:

in ease the artificial light source is anisotropic, said first direction is the maximum emission direction of said artificial light source; otherwise in case the artificial light source is isotropic, said first direction is defined by a straight line which joins the closest points of said artificial light source and chromatic diffuser.

12. The illumination device according to claim 11, wherein the transverse dimension of the chromatic diffuser is equal to or greater than ten times the minimum dimension $d_{min}$.

13. The illumination device according to claim 11, wherein said first non-liquid material has a refractive index $n_1$, and said second non-liquid material has a refractive index $n_2$, and wherein $|n_2/n_1-1|>0.1$.

14. The illumination device according to claim 11, wherein said chromatic diffuser has the shape of a hollow cylinder and said artificial light source has an elongated shape and is positioned coaxially inside said hollow cylinder.

15. The illumination device according to claim 11, wherein the chromatic diffuser is a panel integrated in a wall of a building.

16. The illumination device according to claim 11, wherein said transverse dimension is the maximum dimension of the chromatic diffuser.

17. A chromatically non-uniform illumination device comprising:

an artificial light source with a spectral bandwidth of at least 100 nm in the range of wavelengths between 400 nm and 700 nm, the artificial light source comprising one or more active elements which emit photons or which absorb photons and then re-emits photons at a higher wavelength; and a chromatic diffuser located downstream the artificial light source, which comprises elements of a first non-liquid material transparent to visible light, the elements of the first non-liquid material being dispersed in a second non-liquid material transparent to visible light, the typical linear dimension d of the dispersed elements of the first non-liquid material satisfying the condition 5 nm≤d≤300 nm;

wherein the chromatic diffuser is non-absorbent in the range of wavelengths between 400 nm and 700 nm, and a longitudinal dimension of the chromatic diffuser is equal to or greater than twice a minimum dimension $d_{min}$ of a projection of the largest of said active elements on a first plane perpendicular to a first direction, wherein said longitudinal dimension is defined as the maximum distance between couples of points belonging to the projection of the chromatic diffuser on the first direction, and wherein:

in case the artificial light source is anisotropic, said first direction is the maximum emission direction of said artificial light source; otherwise in case the artificial light source is isotropic, said first direction is defined by a straight line which joins the closest points of said artificial light source and chromatic diffuser;

and wherein said longitudinal dimension is greater than twice a transverse dimension, which is defined as the maximum distance between couples of points belonging to the projection of the chromatic diffuser on the first plane.

18. The illumination device according to claim 17, wherein said longitudinal dimension of the chromatic diffuser is equal to or greater than ten times the minimum dimension $d_{min}$.

19. The illumination device according to claim 17, wherein said first non-liquid material has a refractive index $n_1$, and said second non-liquid material has a refractive index $n_2$, and wherein $|n_2/n_1-1|>0.1$.

20. The illumination device according to claim 17, wherein the chromatic diffuser has the shape of a hollow cylinder and the artificial light source has a circular crown shape and is arranged coaxially in proximity of one end of said hollow cylinder.

* * * * *